US010042406B2

(12) United States Patent
Katayama

(10) Patent No.: US 10,042,406 B2
(45) Date of Patent: Aug. 7, 2018

(54) SEMICONDUCTOR DEVICE

(71) Applicant: KABUSHIKI KAISHA TOSHIBA, Tokyo (JP)

(72) Inventor: Yasuhiro Katayama, Fujisawa Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 130 days.

(21) Appl. No.: 15/253,877

(22) Filed: Sep. 1, 2016

(65) Prior Publication Data

US 2017/0262031 A1 Sep. 14, 2017

(30) Foreign Application Priority Data

Mar. 11, 2016 (JP) ................................. 2016-048892

(51) Int. Cl.
*G06F 1/26* (2006.01)
*H03K 5/135* (2006.01)

(52) U.S. Cl.
CPC ............... *G06F 1/26* (2013.01); *H03K 5/135* (2013.01)

(58) Field of Classification Search
None
See application file for complete search history.

(56) References Cited

U.S. PATENT DOCUMENTS

| 5,461,266 | A | 10/1995 | Koreeda et al. |
| 5,987,616 | A * | 11/1999 | Suzuki ...................... G06F 1/32 712/43 |
| 6,073,195 | A | 6/2000 | Okada |
| 6,448,671 | B1 * | 9/2002 | Wallace ................. B60R 21/01 307/10.1 |
| 2009/0019301 | A1 | 1/2009 | Minami |
| 2011/0197079 | A1 | 8/2011 | Ejiri |

FOREIGN PATENT DOCUMENTS

| JP | H11-212687 A | 8/1999 |
| JP | 3343346 B2 | 11/2002 |
| JP | 2006-031537 A | 2/2006 |
| JP | 2009-015752 A | 1/2009 |
| JP | 2011-164904 A | 8/2011 |
| JP | 2013-011953 A | 1/2013 |

OTHER PUBLICATIONS

Japanese Office Action dated May 22, 2018, filed in counterpart Japanese Patent Application No. 2016-048892 (11 pages) (with translation).

* cited by examiner

*Primary Examiner* — Paul J Yen
(74) *Attorney, Agent, or Firm* — Patterson & Sheridan, LLP

(57) ABSTRACT

According to one embodiment, a semiconductor device includes a bus, a control circuit connected to the bus, a first circuit connected to the bus and configured to operate under control of the control circuit, a power source, a switch element connected between the first circuit and the power source, and a second circuit connected between the bus and the first circuit, the second circuit configured to cause the switch element to enter an on-state in response to a first signal transmitted from the control circuit to the first circuit through the bus.

23 Claims, 17 Drawing Sheets

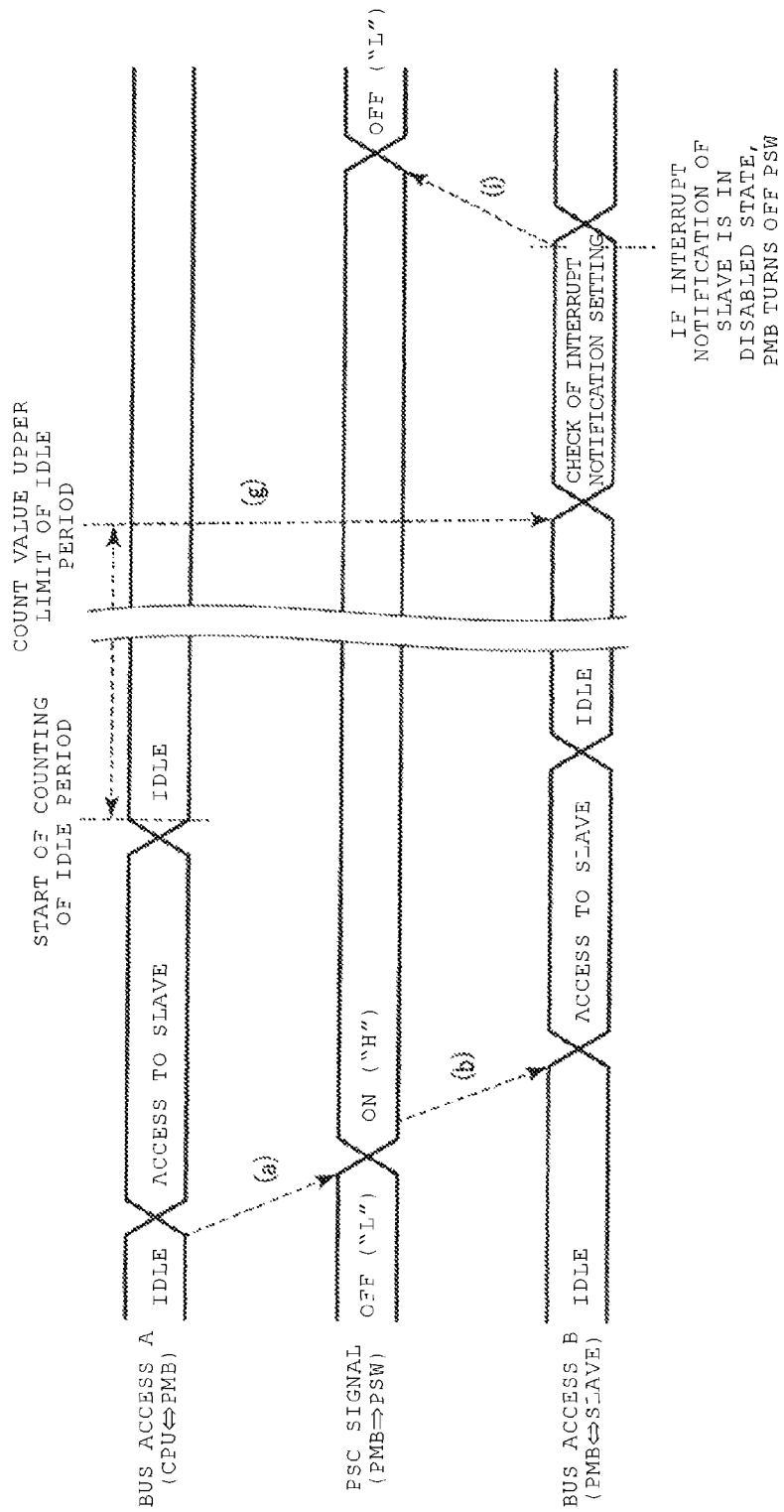

SEMICONDUCTOR DEVICE

CROSS-REFERENCE TO RELATED APPLICATION

This application is based upon and claims the benefit of priority from Japanese Patent Application No. 2016-048892, filed Mar. 11, 2016, the entire contents of which are incorporated herein by reference.

FIELD

Embodiments described herein relate generally to a semiconductor device.

BACKGROUND

There is a method of reducing power consumption, by cutting off power supplied to circuits in a semiconductor device while the circuits are not in use.

DESCRIPTION OF THE DRAWINGS

FIG. 17 is a timing chart of a bus access in the semiconductor device according to the sixth embodiment.

DETAILED DESCRIPTION

Figure 1:
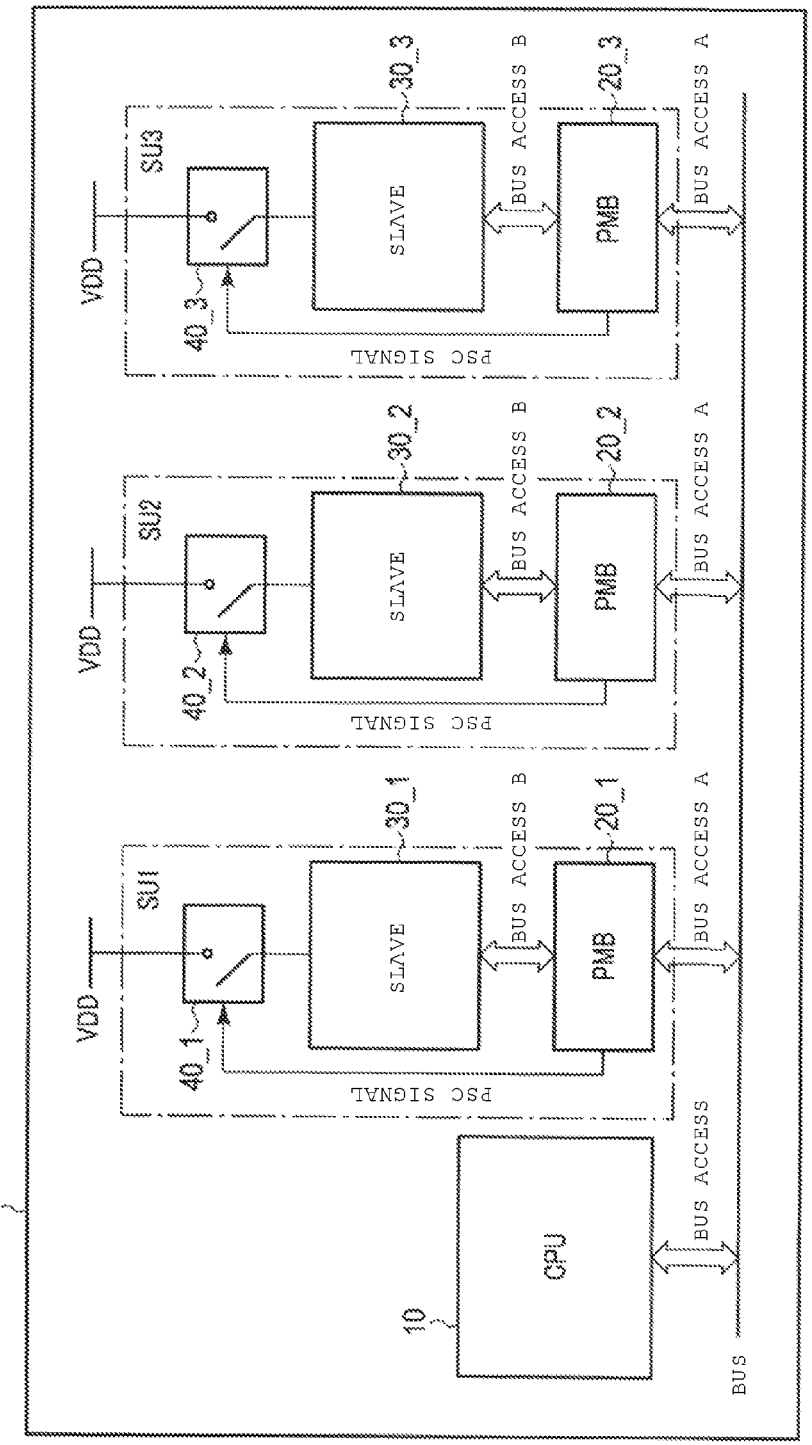
FIG. 1 is a block diagram of a semiconductor device according to a first embodiment.

According to an embodiment, there is provided a semiconductor device capable of reducing power consumption.

In general, according to one embodiment, a semiconductor device includes a bus, a control circuit connected to the bus, a first circuit connected to the bus and configured to operate under control of the control circuit, a power source, a switch element connected between the first circuit and the power source, and a second circuit connected between the bus and the first circuit, the second circuit configured to cause the switch element to enter an on-state in response to a first signal transmitted from the control circuit to the first circuit through the bus.

Hereinafter, embodiments will be described with reference to the drawings. In this explanation, common portions are denoted by common reference numerals, in all of the drawings.

1. First Embodiment

A semiconductor device according to a first embodiment will be described. Hereinafter, a description will be given on a case where the semiconductor device uses large scale integration (LSI) as an example.

1.1 Configuration of Semiconductor Device

First, the configuration of the semiconductor device will be described.

FIG. 1 is a block diagram illustrating an overall configuration of the semiconductor device according to the present embodiment.

As illustrated in FIG. 1, an LSI device 1 includes a central processing unit (CPU) 10 and three slave units SU1 to SU3. In addition, the number of slave units SU can be arbitrarily set.

Each slave unit SU is connected to the CPU 10 through an internal bus. Each slave unit SU includes a power management bridge (PMB) circuit 20, a slave circuit 30, and a power switch (PSW) circuit 40. Hereinafter, if the slave unit SU is not specifically identified, it is assumed that the PMB circuit of the slave unit SU1 is 20_1, the slave circuit thereof is 30_1, and the PSW circuit thereof is 40_1. Similarly, it is assumed that the PMB circuit of the slave unit SU2 is 20_2, the slave circuit thereof is 30_2, and the PSW circuit thereof is 40_2. Further, it is assumed that the PMB circuit of the slave unit SU3 is 20_3, the slave circuit thereof is 30_3, and the PSW circuit thereof is 40_3.

The PMB circuit 20 is connected between the internal bus and the slave circuit 30. The PMB circuit 20 is connected to the PSW circuit 40, and transmits a control signal to the PSW circuit 40. The PMB circuit 20 has a bus bridge function of relaying the access between the slave circuit 30 and the internal bus, and a power control function for the slave circuit 30.

The bus bridge function will be described in detail. The access between the CPU 10 and the slave circuit 30 through the bus (hereinafter, referred to as "bus access") is performed by passing signals from the bus through the PMB circuit 20. Hereinafter, the access between the PMB circuit 20 and the internal bus is referred to as bus access A, and the access between the PMB circuit 20 and the slave circuit 30 is referred to as bus access B.

The PMB circuit 20 has a function of delaying its response to bus access A, as one of the bus bridge functions. For example, if there is a command such as a control signal from the CPU 10 intended for the slave circuit 30, the PMB circuit 20 first turns the power of the slave circuit 30 to an on-state, in other words, turns the PSW circuit 40 to an on-state, and after the passage of a predetermined time, the PMB circuit 20 accesses the slave circuit 30 and transmits the control signal thereto. In other words, the PMB circuit 20 delays the control signal of the CPU 10 (hereinafter, referred to as "a slave control signal) for a predetermined time, and then transmits the delayed control signal to the slave circuit 30.

In addition, the PMB circuit 20 may also functions as an asynchronous bridge if necessary. For example, if the CPU 10 and the slave circuit 30 operate on different clocks, the PMB circuit 20 transmits a slave control signal (commands, addresses, data, and the like) which is transmitted from the CPU 10 through the internal bus, to the slave circuit 30 synchronized with the clock of the slave circuit 30. Even when a signal is transmitted from the slave circuit 30 to the CPU 10, similarly, the PMB circuit 20 transmits a signal which is received from the slave circuit 30, to the CPU 10 on the internal bus, synchronized with the clock of the CPU 10.

If the bus protocol of the bus access A and the bus protocol of the bus access B are different, the PMB circuit has a protocol conversion function. Hereinafter, a description will be given of a case where the CPU 10 and the slave circuit 30 operate at the same clock, and the bus protocol of the bus access A and the bus protocol of the bus access B are the same. In this case, the asynchronous bridge function and the protocol conversion function can be omitted.

Next, a power control function of the slave circuit 30 included in the PMB circuit 20 will be described in detail. The PMB circuit 20 transmits a power switch control (PSC) signal to the PSW circuit 40, and controls the PSW circuit 40. The PSC signal controls the on/off state of the PSW circuit 40. For example, the PMB circuit 20 turns the PSW circuit 40 to an on-state, with the bus access A directed to the slave circuit 30 from the CPU 10 as a trigger. Thus, power, in the form of voltage VDD is supplied to the slave circuit 30. In other words, the PMB circuit 20 controls the supply of the voltage VDD to the slave circuit 30, by controlling the PSW circuit 40.

Further, the PMB circuit 20 in the present embodiment includes a control register (not illustrated) for controlling the PSW circuit 40. The PMB circuit 20 turns the PSW circuit 40 to the off state, for example, by software control. By access to the control register in the PMB circuit 20 from the CPU 10, the PMB circuit cuts off the supply of the voltage VDD from the PSW 40 to the slave circuit 30, in other words, turns off the power of the slave circuit 30.

The slave circuit 30 performs various processes according to control signals of the CPU 10. The slave circuit 30 may turn off the power to the slave circuit 30 during an unused state thereof. The slave circuits 30_1 to 30_3 may have different circuit configurations which respectively perform different processes. Further, the slave circuit 30 is not particularly limited thereto as long as controlled by the CPU 10 and capable of turning off the power during the unused period. For example, an arithmetic circuit, a memory circuit, or a control circuit for controlling an external device maybe used as the slave circuit 30.

The PSW circuit 40 includes a power voltage line connected to the power voltage VDD, and a switching element (for example, a transistor) connected to the slave circuit 30. For example, when the PSC signal is placed at the "H" level, the PSW circuit 40 initiates an on-state (a state in which the switching element is in a conducting state) and the power voltage VDD is supplied to the slave circuit 30. Hereinafter, a description will be given on a case where the PSW circuit 40 (the switching element) is in or switches to an on-state if the PSC signal is in an "H" level. When the PSC signal is at the "L" level, the PSW circuit 40 switches to an off-state.

The CPU 10 is a control circuit that performs various controls in the LSI device 1 in response to instructions from an external device. For example, if the slave circuit 30 is in an unused state, the CPU 10 in the present embodiment initiates the PMB 20 to switch PSW circuit 40 to an off-state and thereby cuts off the supply of the power voltage VDD to the slave circuit 30.

1.2 Configuration of the PMB Circuit

Next, the configuration of the PMB circuit 20 will be described.

Figure 2:
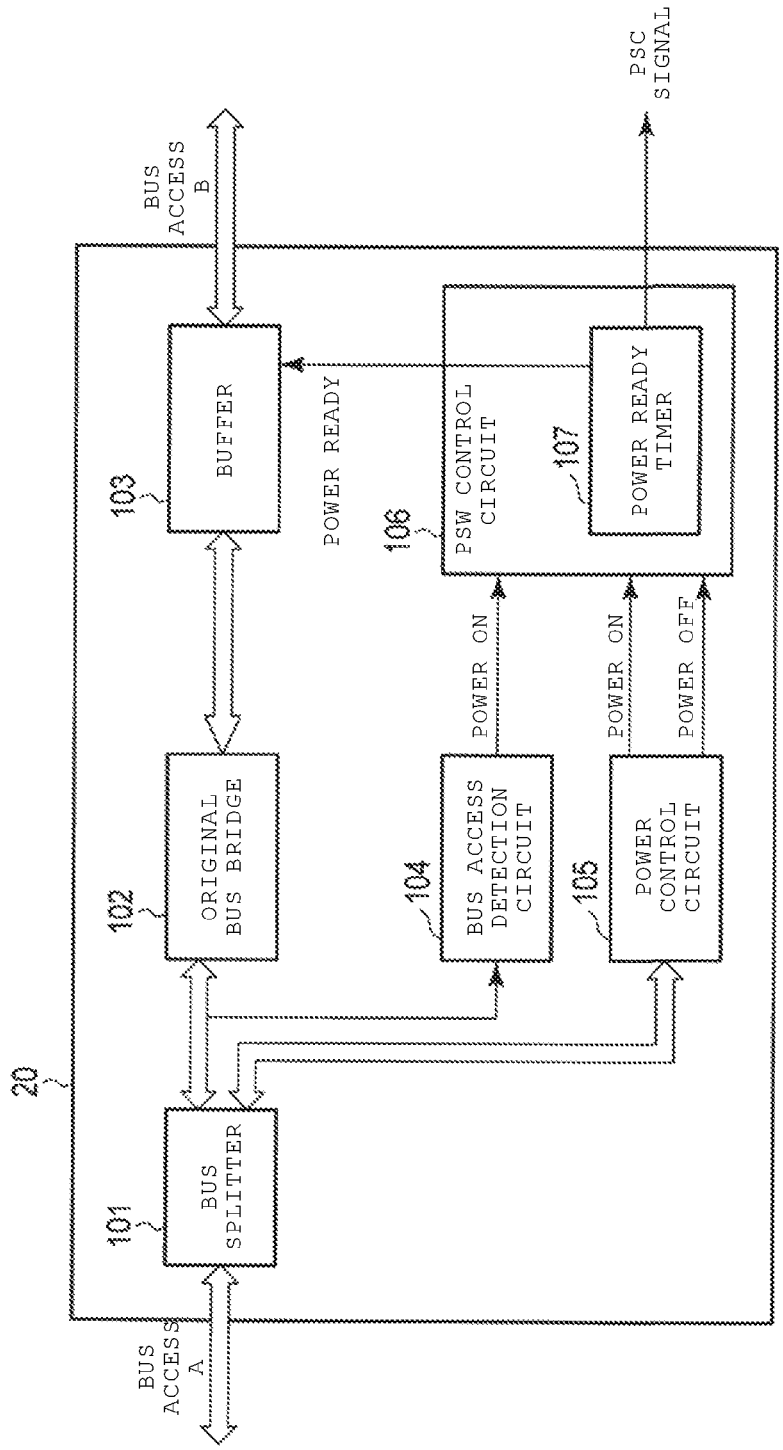
FIG. 2 is a block diagram of a PMB circuit of the semiconductor device according to the first embodiment.

FIG. 2 is a block diagram of a PMB circuit of the semiconductor device according to the present embodiment.

As illustrated in FIG. 2, the PMB circuit 20 includes a bus splitter circuit 101, an original bus bridge circuit 102, a buffer 103, a bus access detection circuit 104, a power control circuit 105, and a PSW control circuit 106.

The bus splitter circuit 101 is connected to the internal bus (bus access A), the original bus bridge circuit 102, the bus access detection circuit 104, and the power control circuit 105. The bus splitter circuit 101 separates bus accesses into a bus access to the control register in the PMB circuit 20 from the CPU 10, and the bus access to the slave circuit 30 (bus access B). More specifically, if the CPU 10 accesses the control register in the PMB circuit 20, the bus splitter circuit 101 transmits the signal (hereinafter, referred to as "PMB control signal") that is received from the CPU 10, to the power control circuit 105. Meanwhile, if the CPU 10 signal is to access the slave circuit 30, the bus splitter circuit 101 transmits the slave control signal that is received from the CPU 10 to the original bus bridge circuit 102 and the bus access detection circuit 104.

The original bus bridge circuit 102 is connected to the buffer 103. The original bus bridge circuit 102 has a bus bridge function, and performs protocol conversion, for example, if the bus protocols of the bus access A and the bus access B are different. In addition, the original bus bridge circuit 102 may be omitted.

The buffer 103 is connected to the slave circuit 30 (bus access B). The buffer 103 is a circuit which delays the bus access to the slave circuit 30 from the CPU 10 to delay the transmission of the slave control signal from the PMU 20 to the slave circuit 30. For example, the buffer 103 waits to access the bus until the power (voltage) becomes stable after the power to the slave circuit 30 is turned on. If a power ready signal transmitted from the PSW control circuit is asserted, the buffer 103 begins accessing the slave circuit 30 by sending the signal received from the CPU 10 through the bus splitter 101. The power ready signal indicates that the slave circuit 30 is in an on-state and the power thereto is in a stable state.

The bus access detection circuit 104 is connected to the PSW control circuit 106. The bus access detection circuit 104 detects a need for the bus to send signals between the CPU 10 and the slave circuit 30. When detecting the bus access to the slave circuit 30 from the CPU 10, i.e., the CPU 10 is sending signals intended for the slave circuit 30, the bus access detection circuit 104 instructs the PSW control circuit 106 to turn on the power to the slave circuit 30. In other words, the bus access detection circuit 104 instructs the PSW control circuit 106 to switch the PSC signal from the "L" level to the "H" level.

The power control circuit 105 is connected to the PSW control circuit 106. The power control circuit 105 includes a control register that controls the PSW circuit 40, in other words, the power on/off to the slave circuit 30 (switching between the "H" level and the "L" level of the PSC signal) by software. The power control circuit 105 instructs the PSW control circuit 106 to turn on or off the PSW circuit 40, depending on the value therefor stored in the control register.

The PSW control circuit 106 transmits the PSC signal to the PSW circuit 40. More specifically, the PSW control circuit 106 makes the PSC signal the "H" level in response to the instruction of the bus access detection circuit 104 or the power control circuit 105, and makes the PSC signal the "L" level in response to the instruction of the power control circuit 105 to do so.

The PSW control circuit 106 includes the power-ready timer 107.

The power-ready timer 107 controls the time period when access from the PMB 20 to the slave circuit 30 is switched on to when the control signal is transmitted from the buffer 103 to the slave circuit 30, in other words, from when the PSC signal is switched from the "L" level to the "H" level to when the power ready signal is asserted. In other words, the power-ready timer 107 controls the power stabilization period of the slave circuit 30.

1.3 Access Operation from CPU to Slave Circuit

Next, the access operation from the CPU 10 to the slave circuit 30 will be described.

1.3.1 Entire Flow of Access Operation

First, the entire flow of the access operation will be described. Hereinafter, to simplify the description, a description will be given of the case where the slave control signal is transmitted from the CPU 10 to the slave circuit 30, and the signal transmitted from the slave circuit 30 to the CPU 10 will be omitted.

Figure 3:
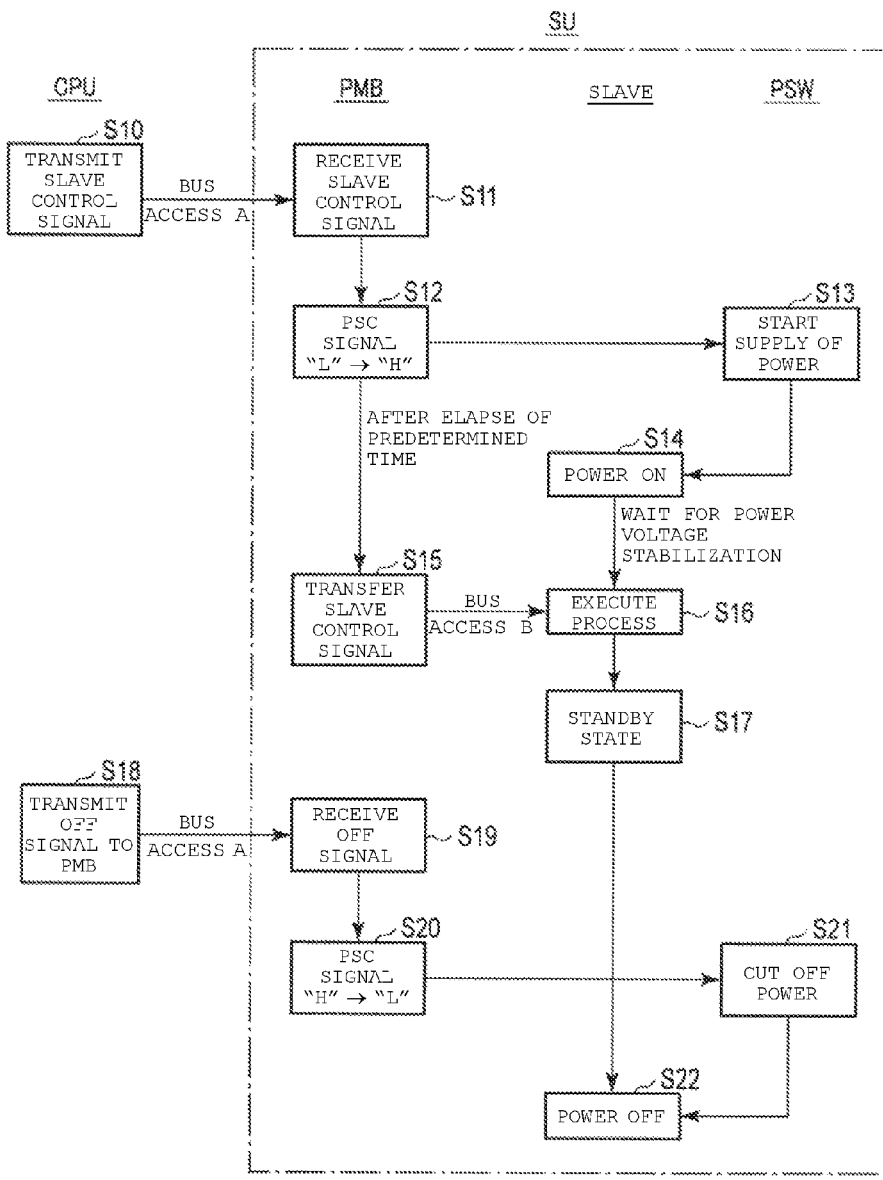
FIG. 3 is a flow chart illustrating an access between a CPU and a slave unit in the semiconductor device according to the first embodiment.

FIG. 3 is a flow chart illustrating access between the CPU and the slave unit in the semiconductor device according to the present embodiment. FIG. 3 more specifically illustrates how the PMB circuit 20, the slave circuit 30, and the PSW circuit 40, which are included in the slave unit SU, operate depending on the signal transmitted from the CPU 10 to the slave unit SU.

As illustrated in FIG. 3, first, the CPU 10 accesses the internal bus (the bus access A), and starts the transmission of the slave control signal to the slave unit SU (step S10). The slave control signal includes, for example, a command, address information, data, and the like.

Next, in the slave unit SU, upon the receipt of the slave control signal through the internal bus (step S11), the PMB circuit 20 switches the PSC signal from the "L" level to the "H" level, and transmits the PSC signal to the PSW circuit 40 (step S12). More specifically, in the PMB circuit 20, the bus splitter circuit 101 transfers the slave control signal to the original bus bridge circuit 102 and to the bus access detection circuit 104. When detecting the slave control signal, the bus access detection circuit 104 instructs the PSW control circuit 106 to turn the PSW circuit 40 to an on-state. The PSW control circuit 106 starts the counting of the power-ready timer 107, and switches the PSC signal from the "L" level to the "H" level.

Next, if the PSC signal is switched from the "L" level to the "H" level, the PSW circuit 40 comes into the on-state, and supplies power (voltage VDD) to the slave circuit 30 (step S13). Thus, the slave circuit 30 comes into the on-state (step S14).

Next, after a certain time elapses since the PSC signal has switched from the "L" level to the "H" level, the PMB circuit 20 accesses the slave circuit 30 (bus access B), and transfers the slave control signal (step S15) thereto. More specifically, in the PMB circuit 20, once the count value reaches a preset value at which it is known that the power is stable, the power-ready timer 107 asserts the power ready signal. The buffer 103 then transfers the slave control signal to the slave circuit 30 in response to the power ready signal.

Next, the slave circuit 30 performs a process corresponding to the slave control signal (step S16).

Next, if the process in the slave circuit 30 is completed and the slave circuit 30 enters a standby-state (step S17), the CPU 10 transmits an off-signal to turn off the power of the slave circuit 30 to the PMB circuit 20 (step S18).

Next, on the reception of the off-signal (step S19), the PMB circuit 20 switches the PSC signal transmitted to the PSW circuit 40 from the "H" level to the "L" level (step S20). More specifically, in the PMB circuit 20, the bus splitter circuit 101 transfers the off-signal to the power control circuit 105. The power control circuit 105 instructs the PSW control circuit 106 to turn the PSW circuit 40 to the off-state, in response to the off-signal. The PSW control circuit 106 switches the PSC signal from the "H" level to the "L" level, in response to the instruction of the power control circuit 105.

Next, if the PSC signal is switched from the "H" level to the "L" level, the PSW circuit 40 switches to the off-state, and the supply of the power voltage VDD to the slave circuit 30 is stopped (step S21). Thus, the slave circuit 30 enters the off-state (step S22).

1.3.2 Timing of Bus Access

Next, the timing of the bus access will be described.

Figure 4:
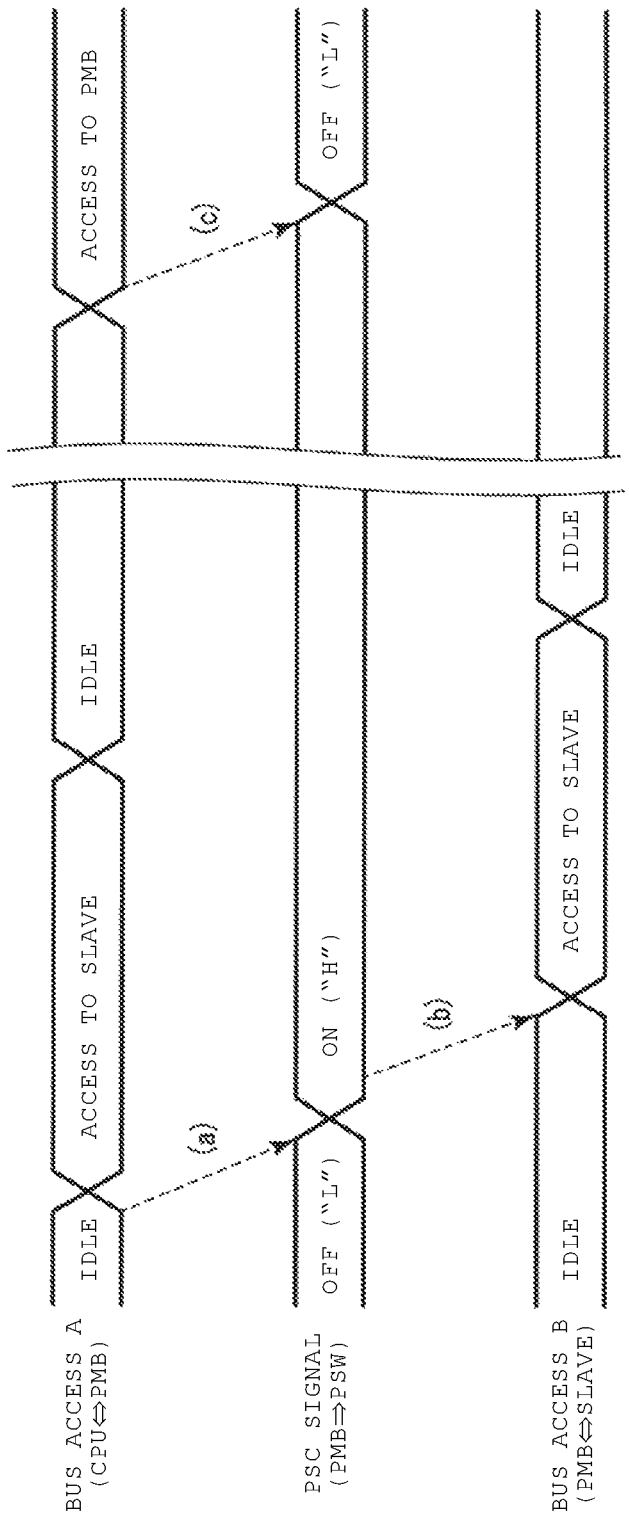
FIG. 4 is a timing chart of a bus access in the semiconductor device according to the first embodiment.

FIG. 4 is a timing chart of a bus access in the semiconductor device according to the present embodiment.

As illustrated in FIG. 4, first, in the bus access A, if the access to the slave circuit 30 from the CPU 10 is detected, the PMB circuit 20 turns the PSW circuit 40 to the on-state by switching the PSC signal, for example, from the "L" level to the "H" level ((a) in FIG. 4). Thus, the slave circuit 30 is supplied with the power voltage VDD, and enters the on-state. Then, after a certain time elapses since the PSC signal is switched from the "L" level to the "H" level, in the bus access B, the PMB circuit 20 starts the access to the slave circuit 30 ((b) in FIG. 4).

After the work of the slave circuit 30 is completed, the CPU 10 accesses the power control circuit 105 in the PMB circuit 20. More specifically, in the bus access A, for example, if the PMB control signal (off-signal) is received from the CPU 10, the PMB circuit 20 switches the PSC signal from the "H" level to the "L" level, and causes the PSW circuit 40 to enter the off-state ((c) in FIG. 4). Thus, the slave circuit 30 cuts off the supply of the power voltage VDD by switching to the off-state.

1.4 Effect According to the Present Embodiment

In the configuration according to the present embodiment, power consumption can be reduced. The effect will be described in detail below.

In the semiconductor device, as a method of reducing the power consumption, a method of cutting off the power to the slave circuit when it is not in use is known, in other words, a method is widely known which reduces power consumption by supplying power to the slave circuit only when it is being used. This is accomplished using a bus bridge circuit that connects the internal bus and the slave circuit, and a separate power management unit (PMU) circuit that controls the power supply state of the slave circuit.

The use state of the slave circuit is dependent on the associated application. Therefore, the power control (on/off control) of the slave circuit, and the control of a waiting period (power stabilization period) from a time when the power to the slave circuit is stable to a time when a control signal is transmitted to the slave circuit is performed by software in the CPU 10, as one of the application operations.

In this case, it is necessary to install a program code for the control in software. Therefore, there is a tendency that the program code is complicated and the development costs and development work period of software for the CPU 10 is increased. Further, since the amount of work in the CPU 10 is increased, correspondingly, the process of the semiconductor device may become slow.

In a case of controlling the power of the slave circuit, for example, there are provided a bus bridge circuit that connects the internal bus and the slave circuit, and a separate power management unit (PMU) circuit that controls the power supply state of the slave circuit. In such a configuration, the bus bridge circuit and the PMU circuit are controlled separately by the CPU. First, the CPU controls the PMU circuit so as to turn the power to the slave circuit to the on-state. Then, after the power is stabilized, the transmission of the signal to the slave circuit through the separate bus bridge circuit is started. Therefore, since the power stabilization period of the slave circuit and the standby time signal to the bus bridge circuit are generated separately after the signal is transmitted from the CPU 10 to the slave circuit, the speed of the process of the semiconductor device may be slow.

In contrast, in the configuration according to the present embodiment, the PMB circuit 20 which is provided between the internal bus and the slave circuit 30 has a bus bridge function and a power control function for the slave circuit 30. Therefore, the PMB circuit 20 is able to perform power control of the slave circuit 30, in response to bus access of a control signal from the CPU 10 directed to the slave circuit 30, and not in response to a separate power-on state switching signal. Accordingly, the power consumption of the slave circuit 30 can be reduced, and the power consumption of the semiconductor device can be reduced.

Further, in the configuration according to the present embodiment, the PMB circuit 20 turns the slave circuit 30 to the on-state, with the bus access of a control signal to the slave circuit 30 from the CPU 10 as a trigger. In other words, without control by the software, the PMB Circuit 20 is able to turn on the slave circuit 30, i.e., cause the power supply to supply power thereto through the PSW circuit 40. Therefore, it is possible to simplify the program related to power control in the CPU 10, and thereby reduce the development cost and development work period of software.

Further, in the configuration according to the present embodiment, since the control of the on-operation of the slave circuit 30 by software is not required, it is possible to reduce the amount of work in the CPU 10. Therefore, it is possible to improve the processing speed of the semiconductor device.

Further, in the configuration according to the present embodiment, since the PMB circuit 20 has the bus bridge function and the power control function of the slave circuit 30, the PMB circuit 20 can overlap the power stabilization period of the slave circuit 30 and the standby time required for the bus bridge function. In other words, the PMB circuit 20 can perform the setup operation of the slave circuit 30, and a standby time process as the bus bridge (a synchronous process of a signal, a protocol conversion, and the like) in parallel. Therefore, it is possible to shorten the standby time until the signal is transmitted from the CPU 10 to the slave circuit 30 through the PMB 20 and thereby improve the processing speed.

Further, in the configuration according to the present embodiment, since the separate PMU circuit is omitted, it is possible to suppress an increase in the chip area.

Further, in the configuration according to the present embodiment, since the PMB circuit 20 does not depend on the configuration of the slave circuit 30, it is possible to use the same PMB circuit 20 in another slave circuit 30, so that a semiconductor device is designed with high design efficiency.

2. Second Embodiment

Next, a second embodiment will be described. The second embodiment is different from the first embodiment in that in a state where the slave circuit 30 is in an idle state, in other words, where power is supplied to the slave circuit 30 but there have been no bus accesses between the CPU 10 and the slave circuit 30 after a certain time elapses, the power to the slave circuit 30 is turned off by the PMB circuit 20. Hereinafter, a description will be given only of the features different from the first embodiment.

2.1 Configuration of PMB Circuit

First, the configuration of the PMB circuit 20 will be described.

Figure 5:
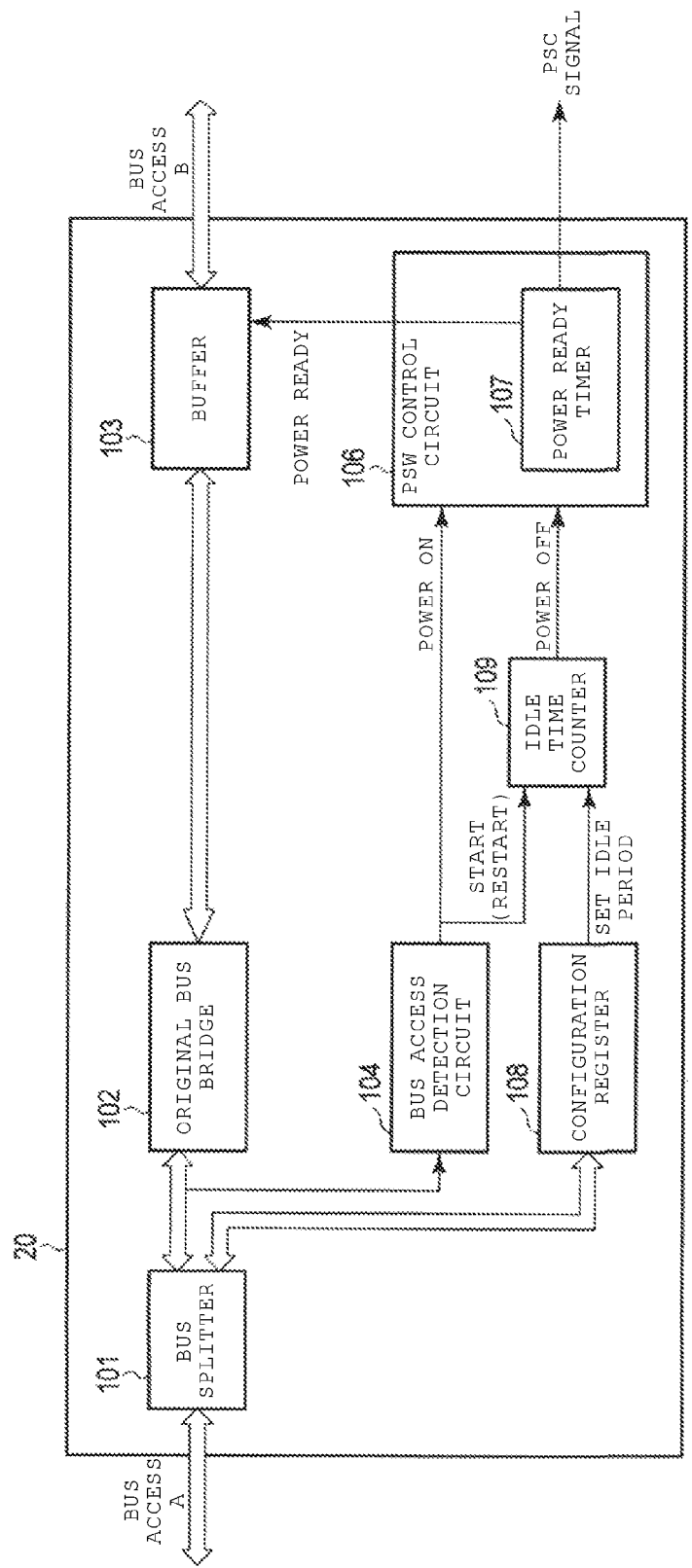
FIG. 5 is a block diagram of a PMB circuit of a semiconductor device according to a second embodiment.

FIG. 5 is a block diagram of a PMB circuit of a semiconductor device according to the present embodiment.

As illustrated in FIG. 5, the PMB circuit 20 includes the bus splitter circuit 101, the original bus bridge circuit 102, the buffer 103, the bus access detection circuit 104, the PSW control circuit 106, a configuration register 108, and an idle time counter 109.

The bus splitter circuit 101 is connected to the internal bus (bus access A), the original bus bridge circuit 102, the bus access detection circuit 104, and the configuration register 108. If the CPU 10 transmits a PMB control signal, the bus splitter circuit 101 transmits the PMB control signal to the configuration register 108.

The bus access detection circuit 104 is connected to the PSW control circuit 106 and the idle time counter 109. If the bus access to the slave circuit 30 from the CPU 10 is detected, in other words, if a slave control signal from the CPU 10 is detected, the bus access detection circuit 104 instructs the PSW control circuit 106 to turn the PSW circuit 40 to the on-state. Further, in a state where the CPU 10 and the slave circuit 30 do not perform bus access, in other words, if the slave circuit 30 comes into an idle state, the bus access detection circuit 104 instructs the idle time counter 109 to start counting.

The configuration register 108 is connected to the idle time counter 109. The configuration register 108 is a register that stores various settings in the PMB circuit 20. For example, in the configuration register 108, the idle time configuration is set by software (CPU 10). The idle time configuration is a set value of the idle period starting when the slave circuit 30 enters the idle state, and once the set value of the idle period is reached in the idle time counter 109, the power is turned off by the PSW control circuit 106 sending a signal to the PSW 40 instructing the PSW to change to the off-state. If the idle time configuration is changed by the CPU 10, the CPU sends a command for the configuration register 108 with the new configuration, and the configuration register 108 transmits the new setting to the idle time counter 109.

The idle time counter 109 is connected to the PSW control circuit 106. The idle time counter 109 measures the length of the idle period. The idle time counter 109 first initializes the counter, according to a count start instruction from the bus access detection circuit 104, and starts counting. If there is again an instruction to start the counting from the bus access detection circuit 104 during the counting, the counting will be restarted. After re-initializing the count value, the idle time counter 109 starts counting again. If the count value reaches the setting value, the idle time counter 109 stops the counting, and instructs the PSW control circuit 106 to turn the PSW circuit 40 (the slave circuit 30) to the off-state.

2.2 Entire Flow of Access Operation

Next, the entire flow of the access operation will be described.

Figure 6:
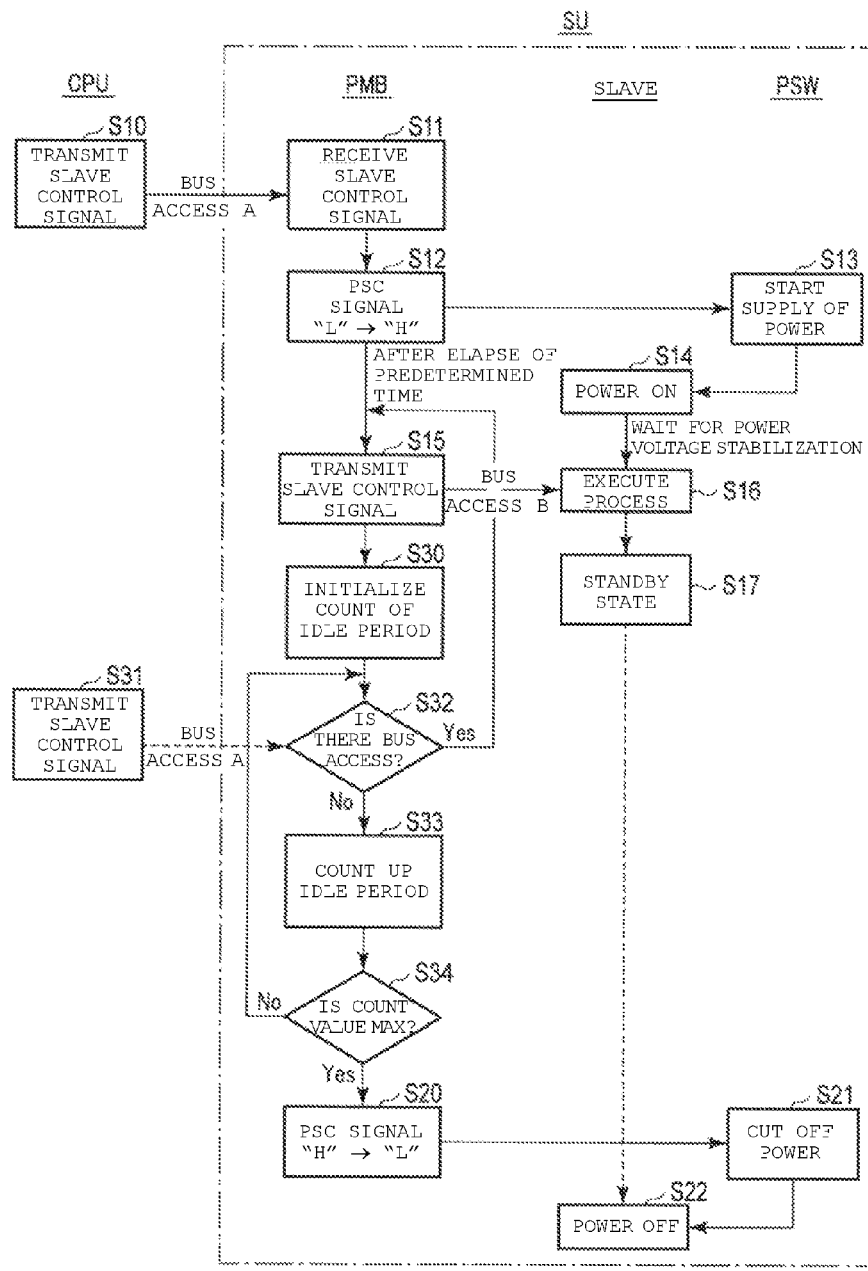
FIG. 6 is a flow chart illustrating an access between a CPU and a slave unit in the semiconductor device according to the second embodiment.

FIG. 6 is a flow chart illustrating an access between the CPU and the slave unit in the semiconductor device according to the present embodiment.

As illustrated in FIG. 6, the operations of steps S10 to step S17 and the operations of steps S20 to S22 are the same as in FIG. 3 of the first embodiment.

After the slave control signal received from the CPU 10 is transmitted to the slave circuit 30 (step S15), the PMB circuit 20 initializes the count value of the idle period in the idle time counter 109 (step S30). Then, in the PMB circuit 20, where the CPU 10 and the slave circuit 30 do not perform bus access, i.e., neither sends a signal to the bus intended for the other and the slave circuit 30 enters the idle state, the bus access detection circuit 104 instructs the idle time counter 109 to start counting the idle period. After performing the initialization of the count value, the idle time counter 109 starts counting up.

If the slave control signal is transmitted to the slave unit SU from the CPU 10 (step S31), in other words, if the PMB circuit 20 detects the bus access from the CPU 10 to send signals to the slave circuit 30 as the idle time counter 109 is counting up (step S32_Yes), the PMB circuit 20 returns to step S15, and transmits the slave control signal to the slave circuit 30. Next, in step S30, the PMB circuit 20 (the bus access detection circuit 104) again initializes the count value of the idle time counter 109. When receiving an instruction to start counting up from the bus access detection circuit 104 during the counting, the idle time counter 109 initializes the count value of the idle period and then resumes counting up.

In contrast, if the slave control signal is not transmitted to the slave circuit 30 from the CPU 10 (step S31) during the counting of the idle period, in other words, if step S31 is not executed, and the PMB circuit 20 does not detect bus access to the slave circuit 30 from the CPU 10 (step S32_No), the PMB circuit 20 performs the counting during the idle period (step S33). In other words, the idle time counter 109 counts up the counter value during the idle period.

If the count value of the idle time counter 109 does not reach a preset value (step S34_No) before a next bus access to the slave circuit 30 from the CPU 10 or vice-versa, the PMB circuit 20 returns to step S32, and repeats the detection of access and the count-up of the idle period. Thus, whenever the PMB 20 is not receiving a signal from the CPU 10 intended for the slave circuit 30 or a signal from the slave circuit 30 intended for the CPU 10, the idle time counter 109 counts up.

If the count value of the idle time counter 109 reaches the preset value (step S34_Yes), the PMB circuit 20 switches the PSC signal from the "H" level to the "L" level (step S20). More specifically, the idle time counter 109 in the PMB circuit 20 instructs the PSW control circuit 106 to turn the PSW circuit 40 to the off-state.

2.3 Timing of Bus Access

Next, the timing of the bus access will be described.

Figure 7:
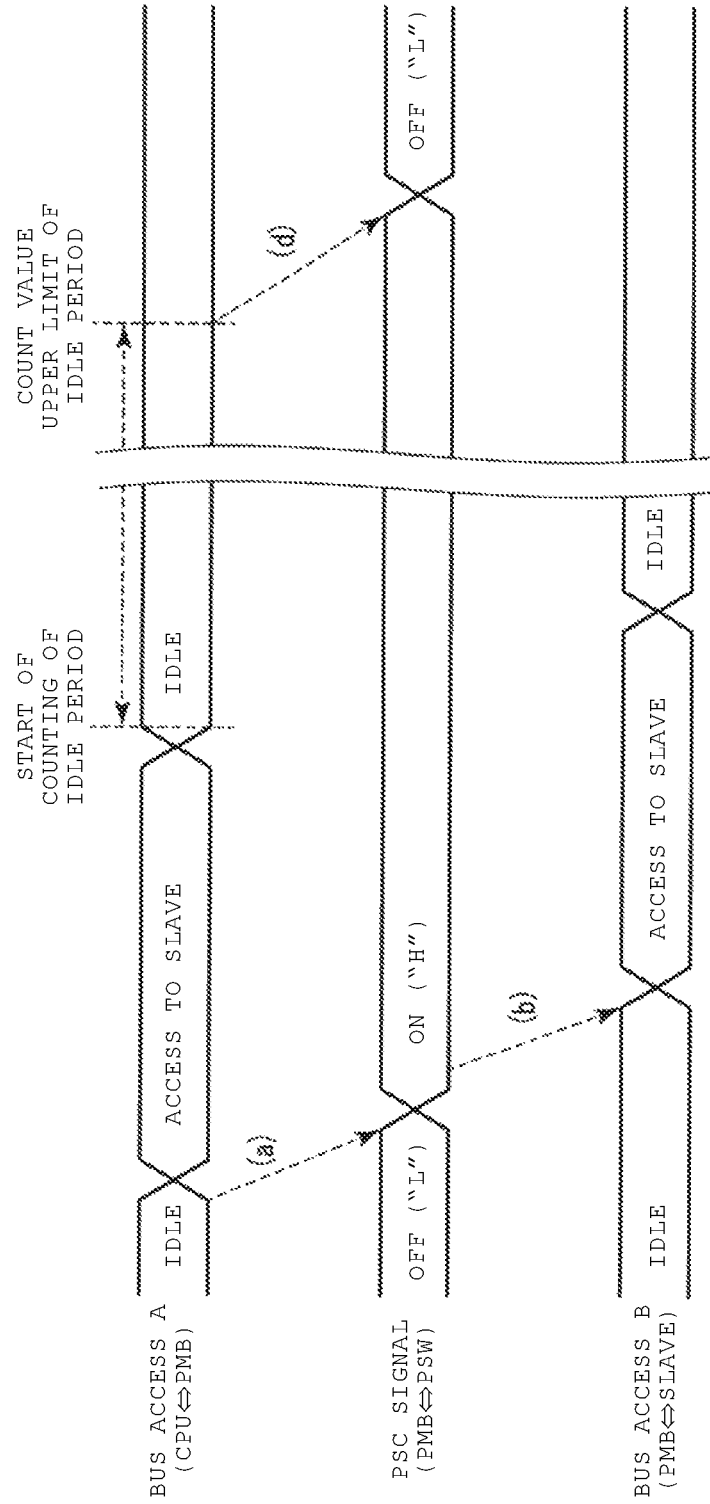
FIG. 7 is a timing chart of a bus access in the semiconductor device according to the second embodiment.

FIG. 7 is a timing chart of a bus access in the semiconductor device according to the present embodiment.

As illustrated in FIG. 7, the timings up to the access to the slave circuit 30 from the CPU 10 ((a) and (b) of FIG. 7) are the same as in FIG. 4 in the first embodiment.

If the access with the CPU 10 is completed in bus access A, the PMB circuit 20 starts the counting of the idle period. After reaching the preset count value, the PMB circuit 20 switches the PSC signal from the "H" level to the "L" level, and turns the PSW circuit 40 to the off-state ((d) of FIG. 7). Thus, the supply of the power voltage VDD to slave circuit 30 is cut off, and the slave circuit 30 enters the off-state.

2.4 Effect According to the Present Embodiment

In the configuration according to the present embodiment, it is possible to achieve the same effect as in the first embodiment.

In addition, if the CPU 10 uses the slave circuit 30, the access is likely to be concentrated in a certain period of time. For example, if the slave circuit 30 is a calculator, the access is concentrated in a time period from the time when data is input and the process is ended until the result is read out or returned by slave circuit 30 to the CPU 10. Further, if the slave circuit 30 is a controller for data transfer, the access is concentrated in the period of data transfer. In addition, if the slave circuit 30 is a storage circuit, the access is concentrated in the period of the write or read operation of the data. Therefore, the period on which the access is concentrated can be regarded as a period (use period) in which the slave circuit 30 executes the process, and the idle period in which there is no access can be regarded as a period (unused period) in which the slave circuit 30 does not execute the process. Therefore, in the case where the idle period continues for a predetermined time or more, the process in the slave circuit is likely to have been completed.

Therefore, in the configuration according to the present embodiment, if the idle period continues for a predetermined time or more, the PMB circuit 20 turns off the slave circuit 30. This can reduce the power consumption of the slave circuit 30. Therefore, the power consumption of the semiconductor device can be reduced.

Further, in the configuration according to the present embodiment, without control by the software of the CPU 10, the PMB circuit 20 can turn off the slave circuit 30, as the CPU 10 need not track the idle time or operating status of multiple slave circuits 30 which with it is communicating. Therefore, it is possible to further simplify the program, and to reduce the development costs and development work period of the software.

Further, in the configuration according to the present embodiment, the PMB circuit 20 includes a register for saving a set value of the idle period. Then, it is possible to change the length of the idle period by changing the setting of the register. Therefore, each PMB circuit 20 can set the idle period according to the corresponding slave circuit 30 to which it is connected.

3. Third Embodiment

Next, a third embodiment will be described. The third embodiment is different from the first and second embodiments in that a single slave unit SU includes two slave circuits 30. Hereinafter, only the features of the embodiment different from the first and second embodiments will be described.

3.1 Configuration of Semiconductor Device

First, the configuration of the semiconductor device will be described.

Figure 8:
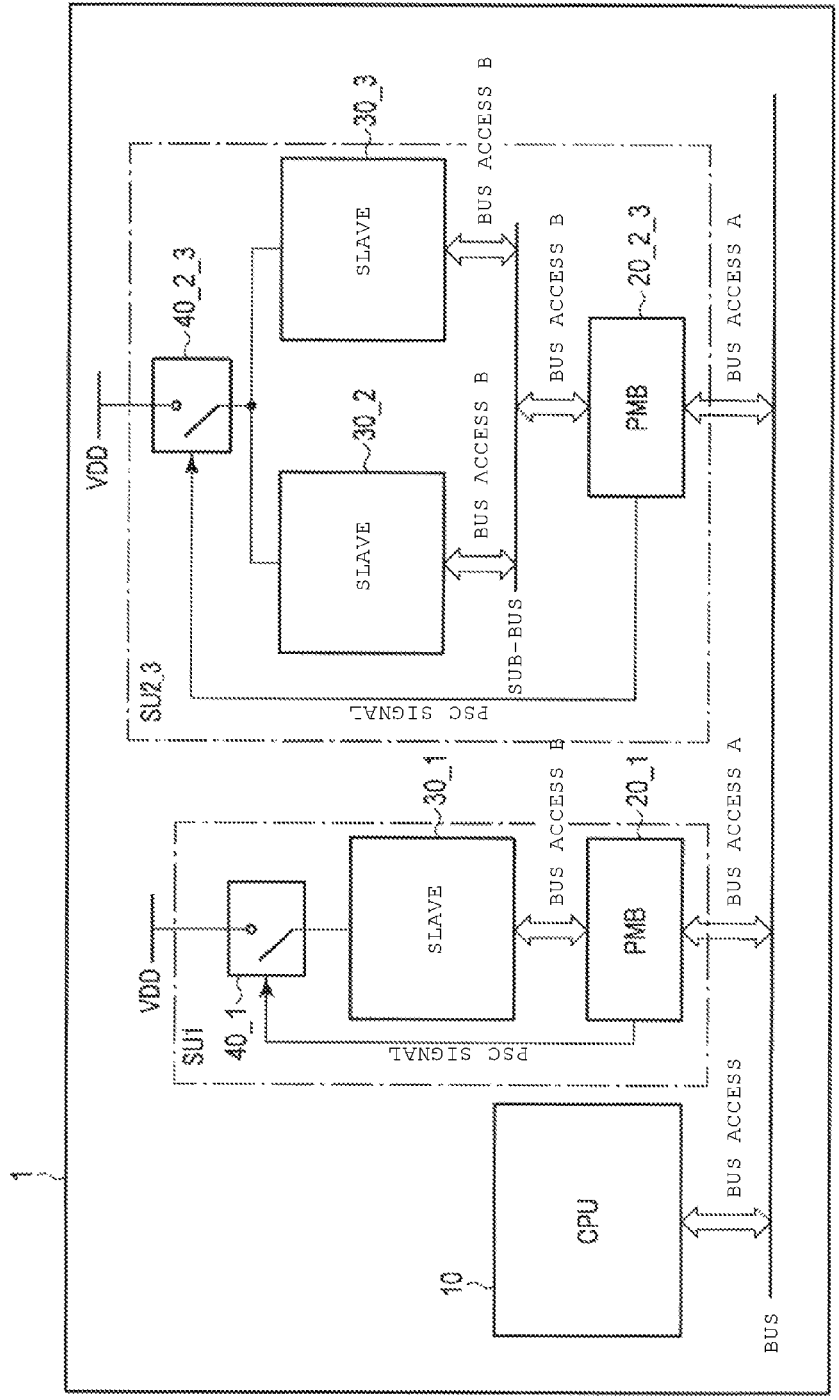
FIG. 8 is a block diagram of a semiconductor device according to a third embodiment.

FIG. 8 is a block diagram illustrating the overall configuration of the semiconductor device according to the present embodiment.

As illustrated in FIG. 8, the LSI device 1 includes the CPU 10 and two slave units SU1 and SU2_3.

The slave unit SU1 is the same as in FIG. 1 in the first embodiment.

The slave unit SU2_3 of the present embodiment includes a PMB circuit 20_2_3, two slave circuits 30_2 and 30_3, a PSW circuit 40_2_3, and a sub-bus. The number of slave circuits 30 in PMB circuit 20_2_3 may be three or more.

The PMB circuit 20_2_3 is connected to the slave circuits 30_2 and 30_3 through the sub-bus. The respective accesses to the PMB circuit 20_2_3 and slave circuits 30_2 and 30_3 through the sub-bus are referred to as a bus access B.

The PMB circuit 20_2_3 turns the PSW circuit 40_2_3 to the on-state, using bus access to the slave circuit 30_2 or 30_3 from the CPU 10 as a trigger. In other words, the PMB circuit 20_2_3 turns the slave circuits 30_2 and 30_3 to the on-state.

Further, similar to the second embodiment, if a state continues for a predetermined time or more in which there is no bus access to the slave circuits 30_2 and 30_3 from the CPU 10, the PMB circuit 20_2_3 turns off the PSW circuit 40_2_3, in other words, the power to slave circuits 30_2 and 30_3. Further, similar to the first embodiment, the PMB circuit 20_2_3 may turn the PSW circuit 40_2_3 to the off-state by internal software control as in the idle time counter 109 of the second embodiment.

The PSW circuit 40_2_3 includes a switching element (for example, a transistor) that connects a power voltage line to which the power voltage VDD is supplied to the slave circuits 30_2 and 30_3. For example, the PSW circuit 40 is turned to the on-state (the switching element is in a conductive state) while the PSC signal is in a "H" level, and the power voltage VDD is supplied to the slave circuits 30_2 and 30_3.

3.2 Effect According to the Present Embodiment

In the configuration according to the present embodiment, it is possible to achieve the same effect as in the first and second embodiments.

Further, in the configuration according to the present embodiment, since a single PMB circuit 20 controls the powers of a plurality of slave circuits 30, it is possible to reduce the number of PMB circuits 20. This can suppress an increase in a chip area.

4. Fourth Embodiment

Next, a fourth embodiment will be described. The fourth embodiment is different from the first to third embodiments in that if there is a bus access of a certain signal (command) to the slave circuit 30 from the CPU 10, the PSW circuit 40 is turned off in response to the access. In this embodiment, a description will be given of a case of transmitting a stop command for stopping the process from the CPU 10 to the slave circuit 30, as an example of the signal (command). Hereinafter, a description will be given only on the features different from those of the first to third embodiments.

4.1 Configuration of PMB Circuit

First, the configuration of the PMB circuit 20 will be described.

Figure 9:
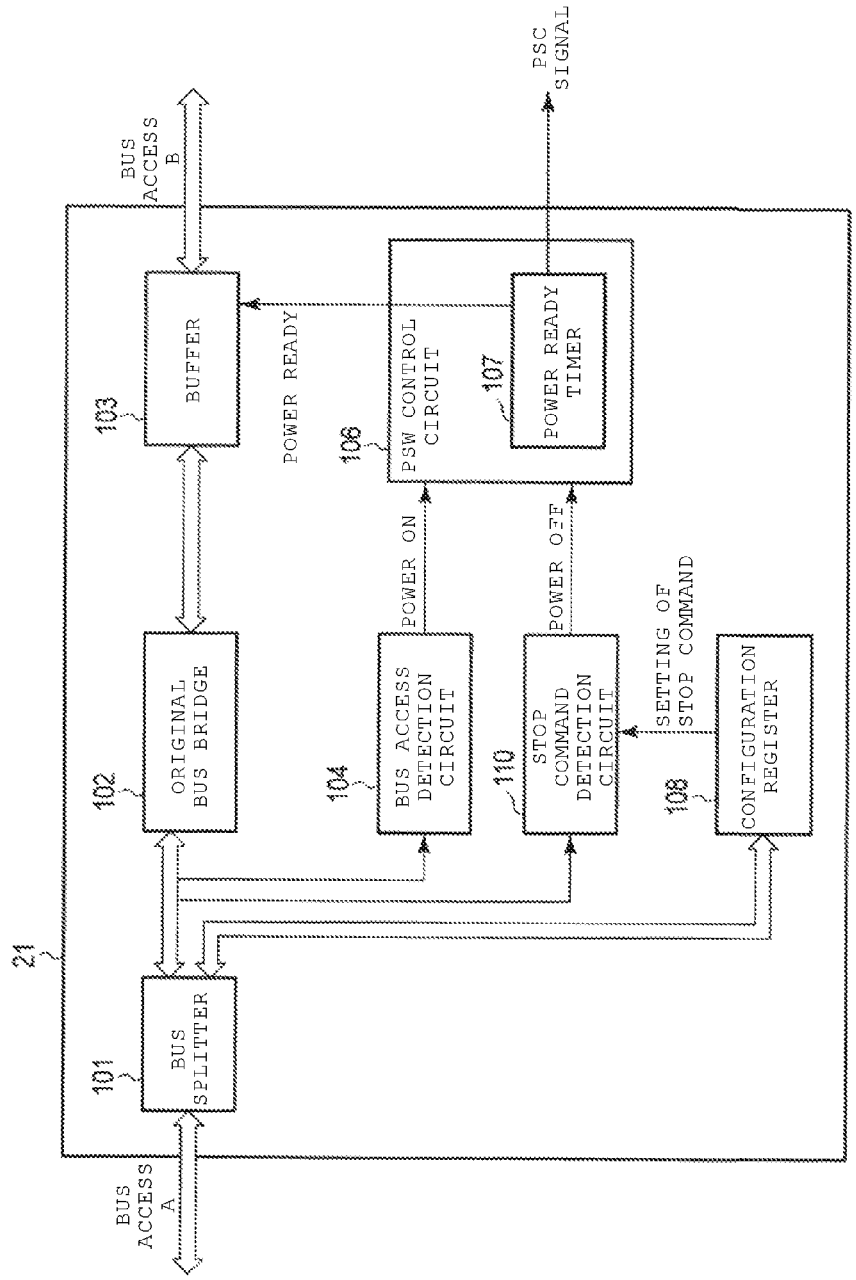
FIG. 9 is a block diagram of a PMB circuit of a semiconductor device according to a fourth embodiment.

FIG. 9 is a block diagram of a PMB circuit of a semiconductor device according to the present embodiment.

As illustrated in FIG. 9, the PMB circuit 20 includes the bus splitter circuit 101, the original bus bridge circuit 102, the buffer 103, the bus access detection circuit 104, the PSW control circuit 106, the configuration register 108, and a stop command detection circuit 110.

The bus splitter circuit 101 is connected to the internal bus (bus access A), the original bus bridge circuit 102, the bus access detection circuit 104, the stop command detection circuit 110, and the configuration register 108. When the CPU 10 accesses the configuration register 108, the bus splitter circuit 101 transmits the PMB control signal which is input from the CPU 10, to the configuration register 108. Meanwhile, when the CPU 10 accesses the slave circuit 30, the bus splitter circuit 101 transmits the slave control signal which is input from the CPU 10, to the original bus bridge circuit 102, the bus access detection circuit 104, and the stop command detection circuit 110.

The bus access detection circuit 104 is connected to the PSW control circuit 106.

The configuration register 108 is connected to the stop command detection circuit 110. The configuration register 108 stores, for example, information on a stop command configuration. The stop command configuration is a set value of information which specifies the stop command to be received from the CPU 10, such as the address of the stop command and the write data thereof. If the stop command configuration is changed by the software in the CPU 10, the configuration register 108 transmits a new set value to the stop command detection circuit 110. Thus, the configuration register 108 maintains the configuration of the stop command and sends it to the stop command detection circuit 110, and if a new configuration of the stop command is sent by the CPU 10, the configuration is stored in the configuration register 108 and transmitted to the stop command detection circuit 110 to update the stop command of the stop command detection circuit 110.

The stop command detection circuit 110 is connected to the PSW control circuit 106. The stop command detection circuit 110 detects a stop command. When the stop command is detected, the stop command detection circuit 110 instructs the PSW control circuit 106 to turn the PSW circuit 40 to the off-state. In addition, the stop command detection circuit 110 may include a counter for counting the time elapsed from the detection of the stop command. In this case, after a preset period elapses from the detection of the stop command, the stop command detection circuit 110 instructs the PSW control circuit 106 to turn the PSW circuit 40 to enter the off-state.

4.2 Entire Flow of Access Operation

Next, the entire flow of the access operation will be described.

Figure 10:
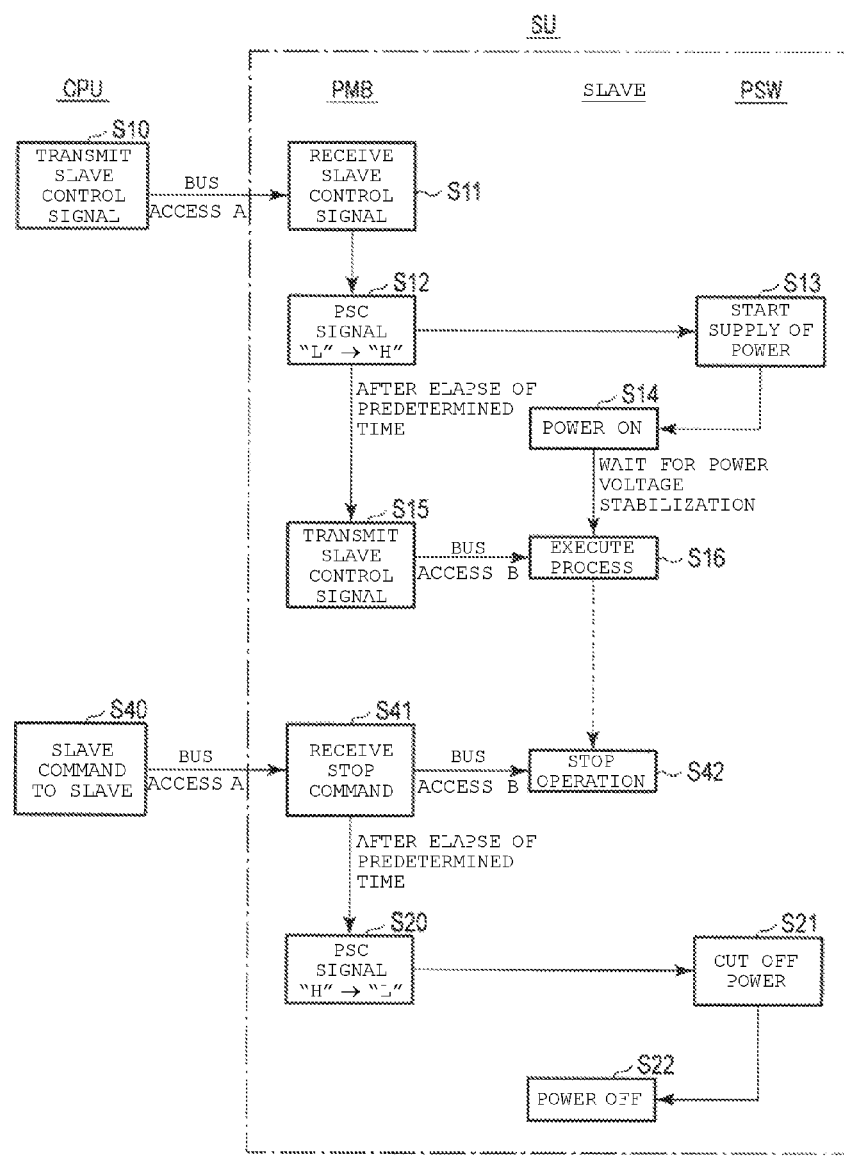
FIG. 10 is a flow chart illustrating an access between a CPU and a slave unit in the semiconductor device according to the fourth embodiment.

FIG. 10 is a flow chart illustrating an access between the CPU and the slave unit in the semiconductor device according to the present embodiment.

As illustrated in FIG. 10, the operations of step S10 to step S16 and the operations of step S20 to step S22 are the same as in FIG. 3 in the first embodiment.

For example, after the process in the slave circuit 30 is ended, the CPU 10 transmits a stop command to stop the slave circuit 30 to the slave unit SU (slave circuit 30) (step S40).

Next, on the reception of the stop command (step S41), the PMB circuit 20 transmits the stop command to the slave circuit 30. Thus, for example, even if the process is not ended, the slave circuit 30 stops the process and stops the operation (step S42).

Next, after a certain time elapses after the stop command is transmitted to the slave circuit 30, the PMB circuit switches the PSC signal from the "H" level to the "L" level (step S20).

4.3 Timing of Bus Access

Next, the timing of a bus access will be described.

Figure 11:
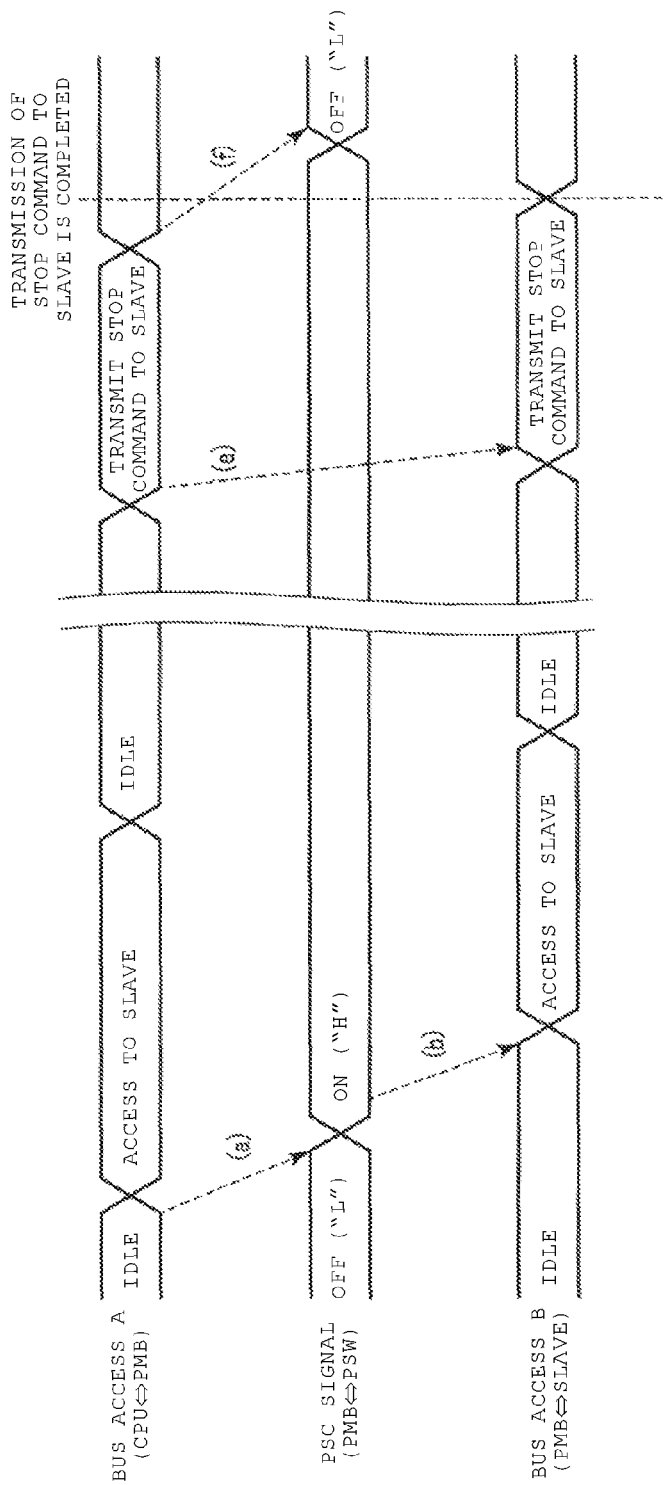
FIG. 11 is a timing chart of a bus access in the semiconductor device according to the fourth embodiment.

FIG. 11 is a timing chart of a bus access in the semiconductor device according to the present embodiment.

As illustrated in FIG. 11, timings ((a) and (b) of FIG. 11) for the access to the slave circuit 30 from the CPU 10 is the same as in FIG. 4 in the first embodiment.

When receiving the stop command from the CPU 10 in the bus access A, the PMB circuit 20 transmits the stop command to the slave circuit 30 in the bus access B ((e) of FIG. 11). After a predetermined time elapses from the completion of the transmission of the stop command to the slave circuit 30, the PMB circuit 20 switches the PSC signal from the "H" level to the "L" level, and turns the PSW circuit 40 to the off-state ((f) of FIG. 11)). Thus, the supply of the power voltage VDD is cut off, and the slave circuit 30 enters the off-state.

4.4 Effects According to Present Embodiment

In the configuration according to the present embodiment, it is possible to achieve the same effect as in the first embodiment.

Further, in the configuration according to the present embodiment, the PMB circuit 20 switches the PSW circuit 40 to the off-state using a certain command (for example, the stop command) which is transmitted from the CPU 10 to the slave circuit 30 as a trigger. Thus, the PMB circuit 20 checks that the slave circuit 30 enters an unused state in response to the certain command, and can turn off the slave circuit 30. Therefore, it is possible to shorten the period when the slave circuit 30 is maintained in the idle state while still powered, and thus it is possible to reduce the power consumption more effectively.

Further, in the configuration according to the present embodiment, after checking that the slave circuit 30 enters an unused state in response to the certain command, the PMB circuit 20 turns off the power of the slave circuit 30. Thus, it is possible to suppress the unintended action, such as to turn off the power of the slave circuit 30 by mistake when the slave circuit 30 is in use state. Accordingly, it is possible to improve the reliability of the semiconductor device.

Further, in the configuration according to the present embodiment, without control by the CPU 10 software, the PMB circuit 20 is able to turn off the slave circuit 30. Therefore, it is possible to simplify the program, and to reduce the development cost and development work period of software.

Further, the PMB circuit 20 includes a register for saving a set value for the command to be a trigger. Therefore, each PMB circuit 20 can set a different command as a trigger, in accordance with the use or other requirements of a corresponding slave circuit 30.

5. Fifth Embodiment

Next, a fifth embodiment will be described. In the fifth embodiment, the PMB circuit 20 checks the state of the slave circuit 30, and if the slave circuit 30 is in an idle state, the PMB circuit 20 turns off the slave circuit 30. Hereinafter, a description will be given only on the features different from the first to fourth embodiments.

5.1 Configuration of PMB Circuit

First, the configuration of the PMB circuit 20 will be described.

Figure 12:
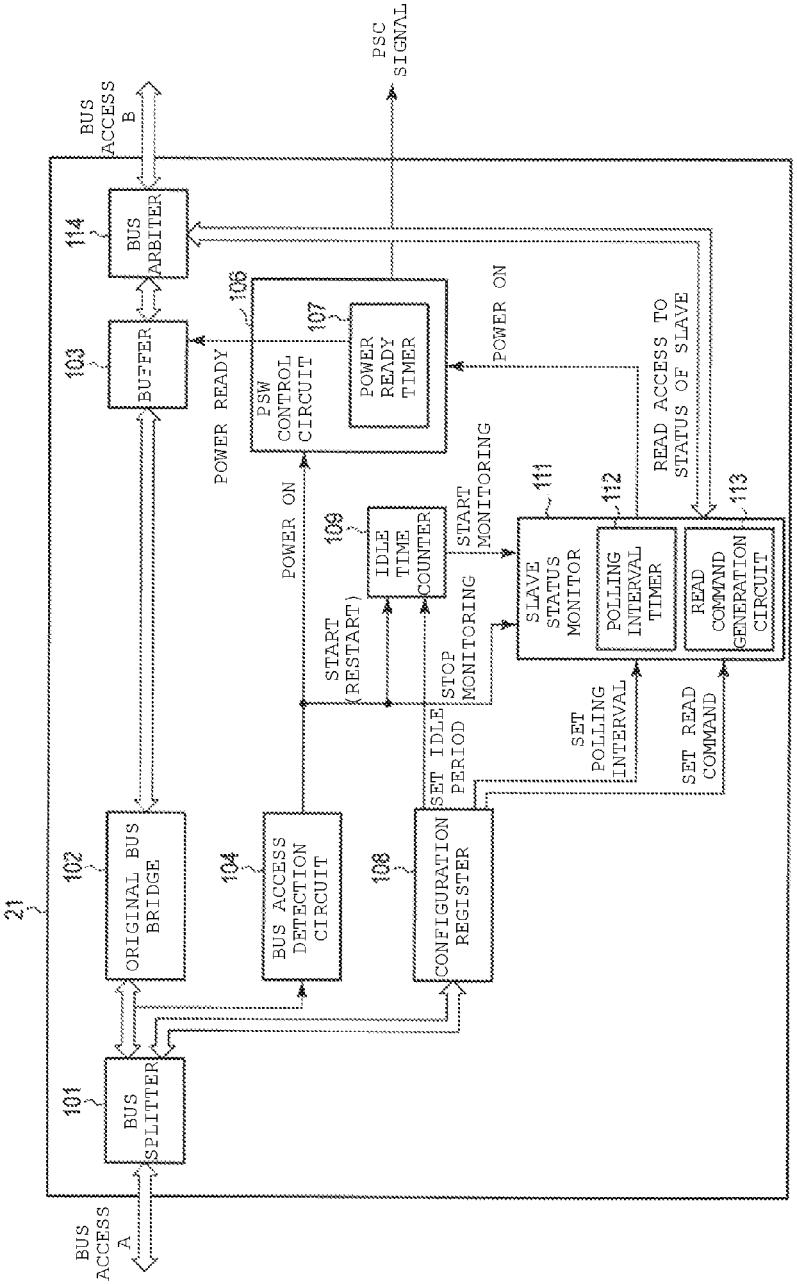
FIG. 12 is a block diagram of a PMB circuit of a semiconductor device according to a fifth embodiment.

FIG. 12 is a block diagram of a PMB circuit of a semiconductor device according to the present embodiment.

As illustrated in FIG. 12, the PMB circuit 20 includes the bus splitter circuit 101, the original bus bridge circuit 102, the buffer 103, the bus access detection circuit 104, the PSW control circuit 106, the configuration register 108, the idle time counter 109, a slave status monitor 111, and a bus arbiter 114.

The bus splitter circuit 101 is connected to the internal bus (bus access A), the original bus bridge circuit 102, the bus access detection circuit 104, and the configuration register 108.

The bus access detection circuit 104 is connected to the PSW control circuit 106, the idle time counter 109, and the slave status monitor 111. When detecting the bus access of a signal to the slave circuit 30 from the CPU 10, the bus access detection circuit 104 instructs the PSW control circuit 106 to turn on the power of the slave circuit 30. Further, the bus access detection circuit 104 instructs the slave status monitor 111 to stop the monitoring of the slave circuit 30. Further, when there are no bus accesses between the CPU 10 and the slave circuit 30 (the idle state), the bus access detection circuit 104 transmits a start signal to instruct the idle time counter 109 to start counting.

The configuration register 108 is connected to the idle time counter 109, and the slave status monitor 111. The configuration register 108 stores, for example, information on an idle time configuration, a polling interval configuration, and a read command configuration. The polling interval configuration is a set value of the issuance interval of the register read command that the slave status monitor 111 issues. The read command configuration is address information of the register read command that the slave status monitor 111 issues, or a set value for a method of analyzing register information that is read from the slave circuit 30 (a read value of the register that can be determined as the unused state). If the idle time configuration is changed by software, the configuration register 108 transmits a new set value to the idle time counter 109. Further, if the polling interval configuration or the read command configuration is changed by software, the configuration register 108 transmits a new set value to the slave status monitor 111.

The idle time counter 109 is connected to the slave status monitor 111. The idle time counter 109 starts counting in response to the instruction by the bus access detection circuit 104 to do so, and if the count value reaches a set value, the idle time counter 109 stops counting and instructs the slave status monitor 111 to start monitoring the slave circuit 30.

The slave status monitor 111 is connected to the bus arbiter 114 and the PSW control circuit 106. The slave status monitor 111 monitors whether or not the slave circuit 30 is in the unused state. Upon receipt of instruction from the idle time counter 109, the slave status monitor 111 issues a register read command to the slave circuit 30 at regular intervals. If the register value of the slave circuit 30 indicates that the slave circuit 30 is in the unused state, the slave status monitor 111 instructs the PSW control circuit 106 to turn the power of the slave circuit 30 to the off-state. The slave status monitor 111 stops the monitoring of the slave circuit 30, in response to the instruction from the bus access detection circuit 104. In other words, when detecting a bus access to the slave circuit 30 from the CPU 10, the slave status monitor 111 stops the monitoring of the slave circuit 30.

The slave status monitor 111 includes a polling interval timer 112 and a read command generation circuit 113.

The polling interval timer 112 controls the issuance interval of the register read command that the slave status monitor 111 issues.

The read command generation circuit 113 issues the register read command.

The bus arbiter 114 is connected to the slave circuit 30(bus access B). The bus arbiter 114 has an arbitration function for access between the CPU 10 and the slave circuit 30 and the access between the slave status monitor 111 and the slave circuit 30. More specifically, for example, if the slave status monitor 111 and the slave circuit 30 are in access, the bus arbiter 114 waits to allow access to the slave circuit 30 from the CPU 10.

5.2 Entire Flow of Access Operation

Next, the entire flow of the access operation will be described.

Figure 13:
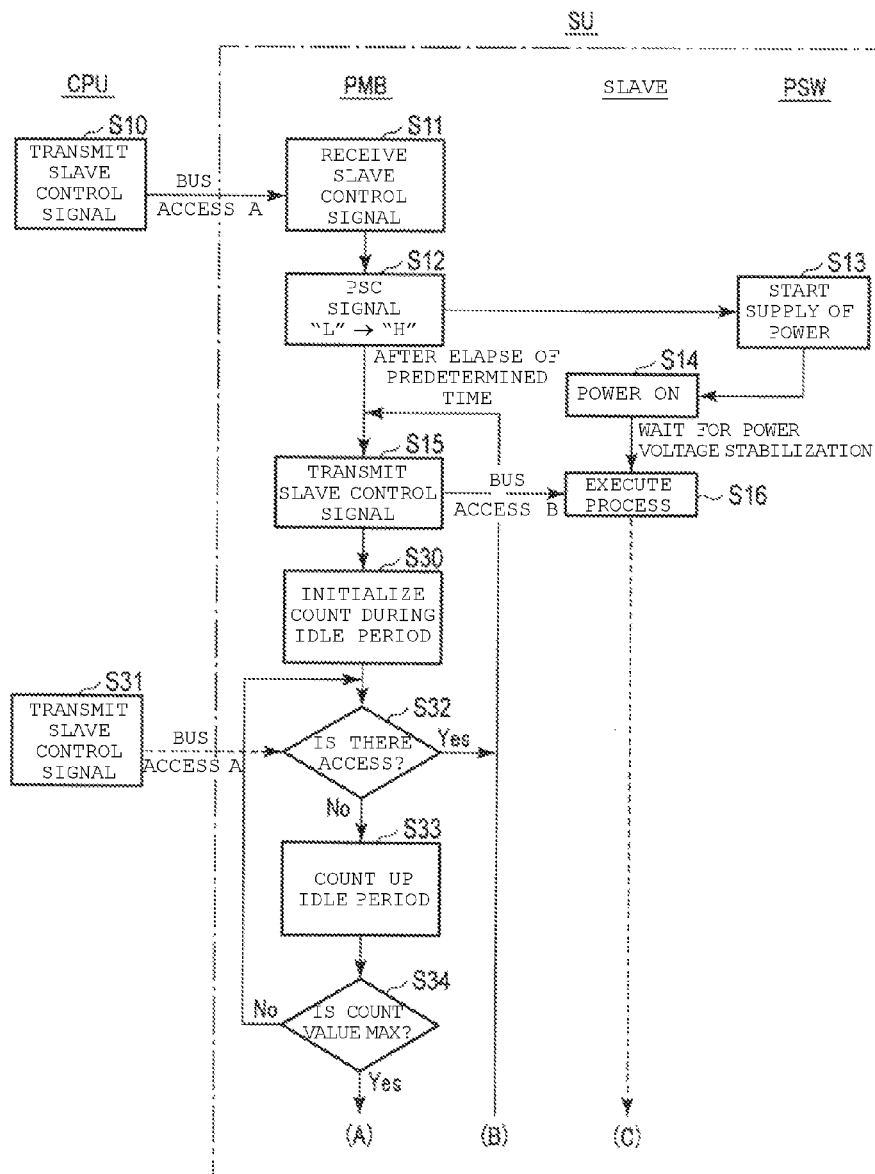
FIG. 13 is a flow chart illustrating an access between a CPU and a slave unit in the semiconductor device according to the fifth embodiment.
Figure 14:
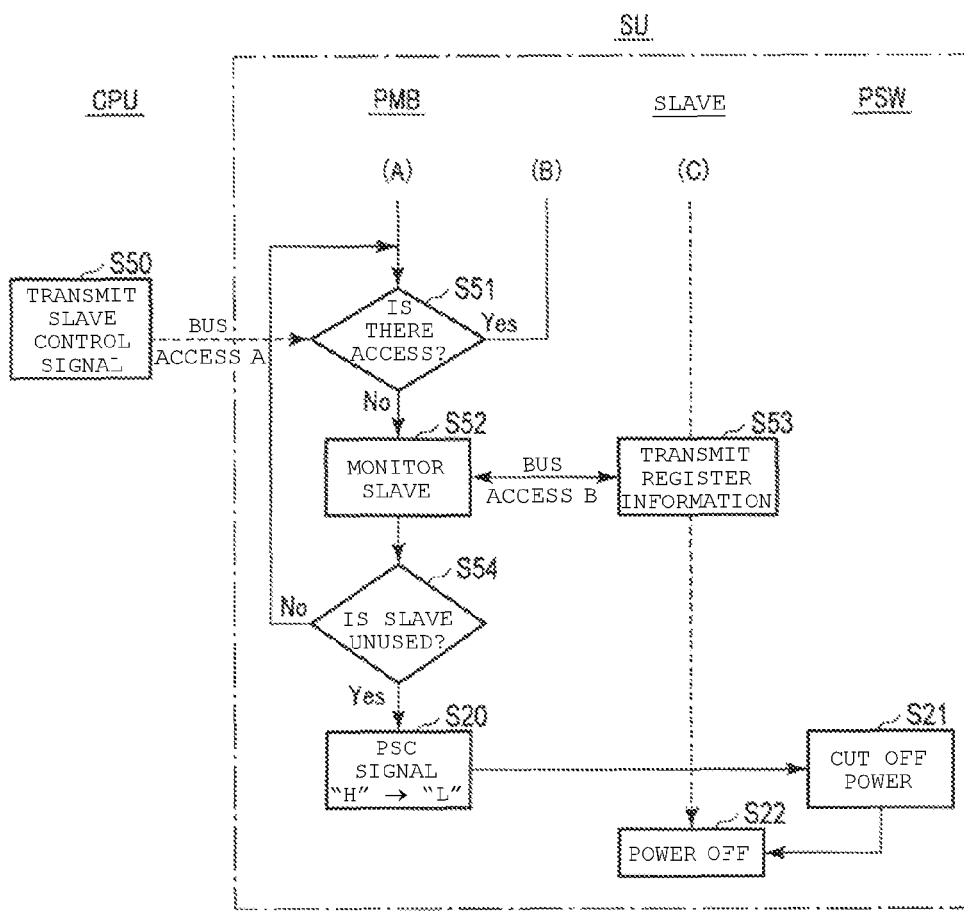
FIG. 14 is a flow chart illustrating an access between the CPU and the slave unit of the semiconductor device according to the fifth embodiment.

FIG. 13 and FIG. 14 are flow charts illustrating access between the CPU and the slave unit in the LSI device 1 according to the present embodiment.

As illustrated in FIG. 13 and FIG. 14, the operations of step S10 to step S16, the operations of step S20 to S22, and the operations of step S30 to S34 are the same as in FIG. 6 in the second embodiment.

If the count value of the idle time counter 109 reaches the preset value (step S34_Yes), the PMB circuit 20 starts the monitoring of the slave circuit 30.

More specifically, if a slave control signal is transmitted from the CPU 10 to the slave circuit 30 (step S50), in other words, if the PMB circuit 20 detects bus access to the slave circuit 30 from the CPU 10 (step S51_Yes), the PMB circuit 20 returns to step S15, and transmits the slave control signal to the slave circuit 30, without performing monitoring of the slave circuit 30.

Meanwhile, if a slave control signal is not transmitted from the CPU 10 to the slave circuit 30, in other words, if step S50 is not executed and the PMB circuit 20 does not detect the bus access to the slave circuit 30 from the CPU 10, (step S51_No), the PMB circuit 20 issues a register read command in order to monitor the slave circuit 30, and transmits the register read command to the slave circuit 30 (step S52). The slave circuit 30 transmits register information to the PMB circuit 20 in response to the register read command (step S53).

If it is determined that the slave circuit 30 is in an used state based on the acquired register information (step S54_No), the PMB circuit 20 returns to step S51, and continues detection of bus access from the CPU 10 to the slave circuit 30 and the monitoring of the slave circuit 30. In other words, during the period after the first register read command, so long as there is no access from the CPU 10 to the slave circuit 30, the PMB circuit 20 regularly repeats the acquisition of the register information of the slave circuit 30 regularly until the slave circuit 30 enters an unused state.

If it is determined based on the acquired register information that the slave circuit 30 is in the unused state (step S54_Yes), the PMB circuit 20 switches the PSC signal from the "H" level to the "L" level (step S20). If bus access from the CPU 10 to the slave circuit is detected before the register read detects that the slave circuit 30 is in the unused state, the PMB 20 returns to step S15.

5.3 Timing of Bus Access

Next, the timing of the bus access will be described.

Figure 15:
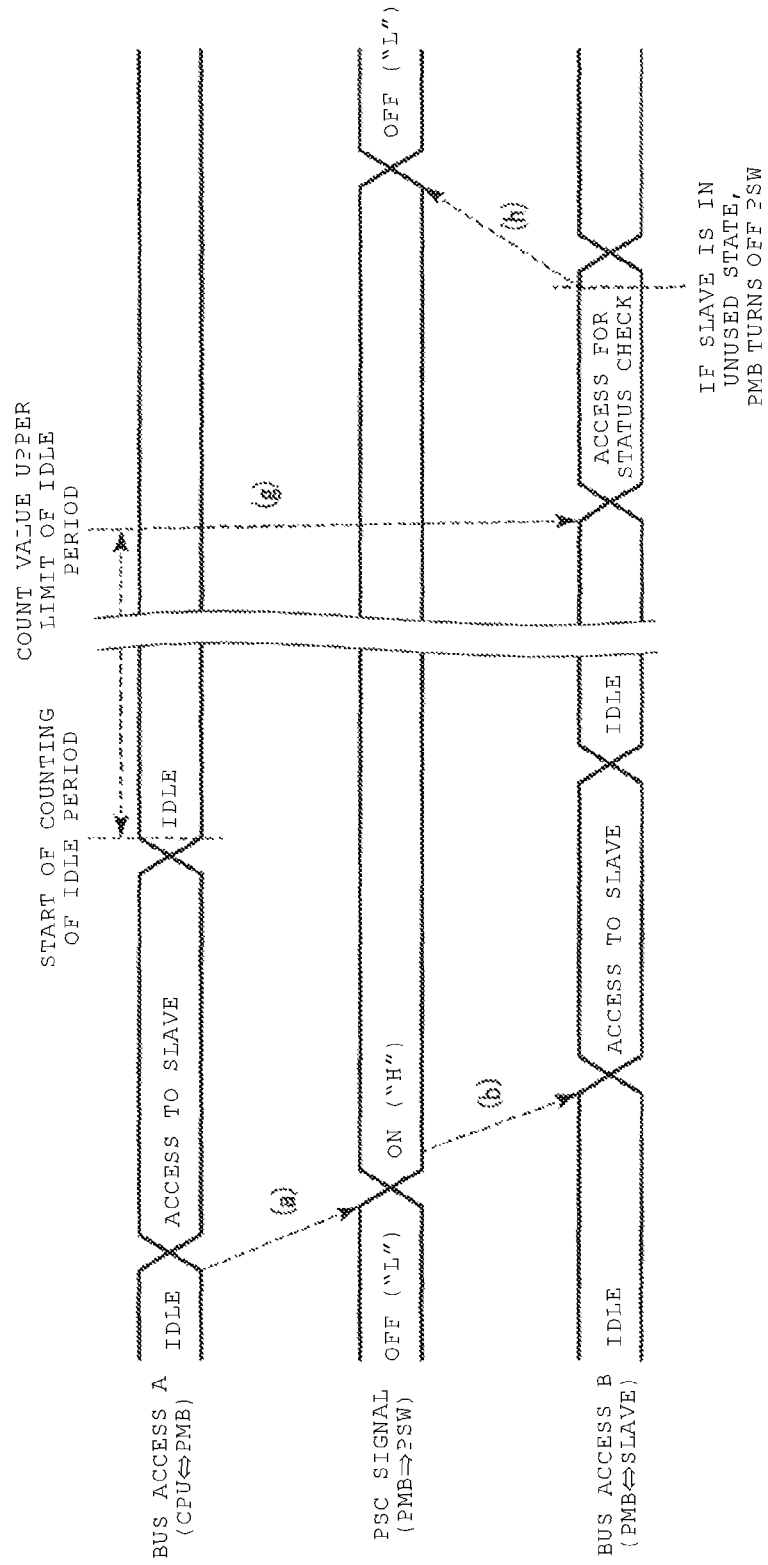
FIG. 15 is a timing chart of a bus access in the semiconductor device according to the fifth embodiment.

FIG. 15 is a timing chart of a bus access in the semiconductor device according to the present embodiment.

As illustrated in FIG. 15, the flow up to the access to the slave circuit 30 from the CPU 10 ((a) and (b) of FIG. 15) is the same as in FIG. 4 in the first embodiment.

In the PMB circuit 20, if the access with the CPU 10 is completed in the bus access A, the counting of the idle period is started, and when the counted value reaches a preset count value, the status of the slave circuit 30 is checked in the bus access B, such that a regular access to the slave circuit 30 is started ((g) of FIG. 15). If it is determined that the slave circuit 30 is in the unused state, the PMB circuit 20 switches the PSC signal from the "H" level to the "L" level, and turns the PSW circuit 40 to the off-state ((h) of FIG. 15). Thus, the supply of the power voltage VDD is cut off, and the slave circuit 30 enters the off-state.

5.4 Effect According to the Present Embodiment

In the configuration according to the present embodiment, it is possible to achieve the same effect as in the first embodiment.

Further, in the configuration according to the present embodiment, if a state continues for a predetermined time in which there is no bus access to the slave circuit 30 from the CPU 10, the PMB circuit 20 periodically checks the state of the slave circuit 30. After checking that the slave circuit 30 has entered the unused state, the PMB circuit 20 turns off the power of the slave circuit 30. Therefore, it is possible to shorten the period when the slave circuit 30 is maintained in the idle state, and thus it is possible to reduce the power consumption more effectively.

Further, in the configuration according to the present embodiment, after checking that the slave circuit 30 enters the unused state, the PMB circuit 20 turns off the power of the slave circuit 30. Thus, it is possible to suppress the unintended action, such as to turn off the power of the slave circuit 30 by mistake when the slave circuit 30 is still in the use state after the counted idle period has ended. Accordingly, it is possible to improve the reliability of the semiconductor device.

Further, in the configuration according to the present embodiment, without control by the software, the PMB circuit 20 is able to turn off the slave circuit 30. Therefore, it is possible to simplify the program, and reduce the development cost and development work period of software.

6. Sixth Embodiment

Next, a sixth embodiment will be described. The sixth embodiment is different from the fifth embodiment in that the slave circuit 30 has a function to issue an interrupt notification to the CPU 10. Hereinafter, a description will be given only on the fact different from the first to fifth embodiments.

6.1 Configuration of Semiconductor Device

First, the configuration of the semiconductor device will be described.

Figure 16:
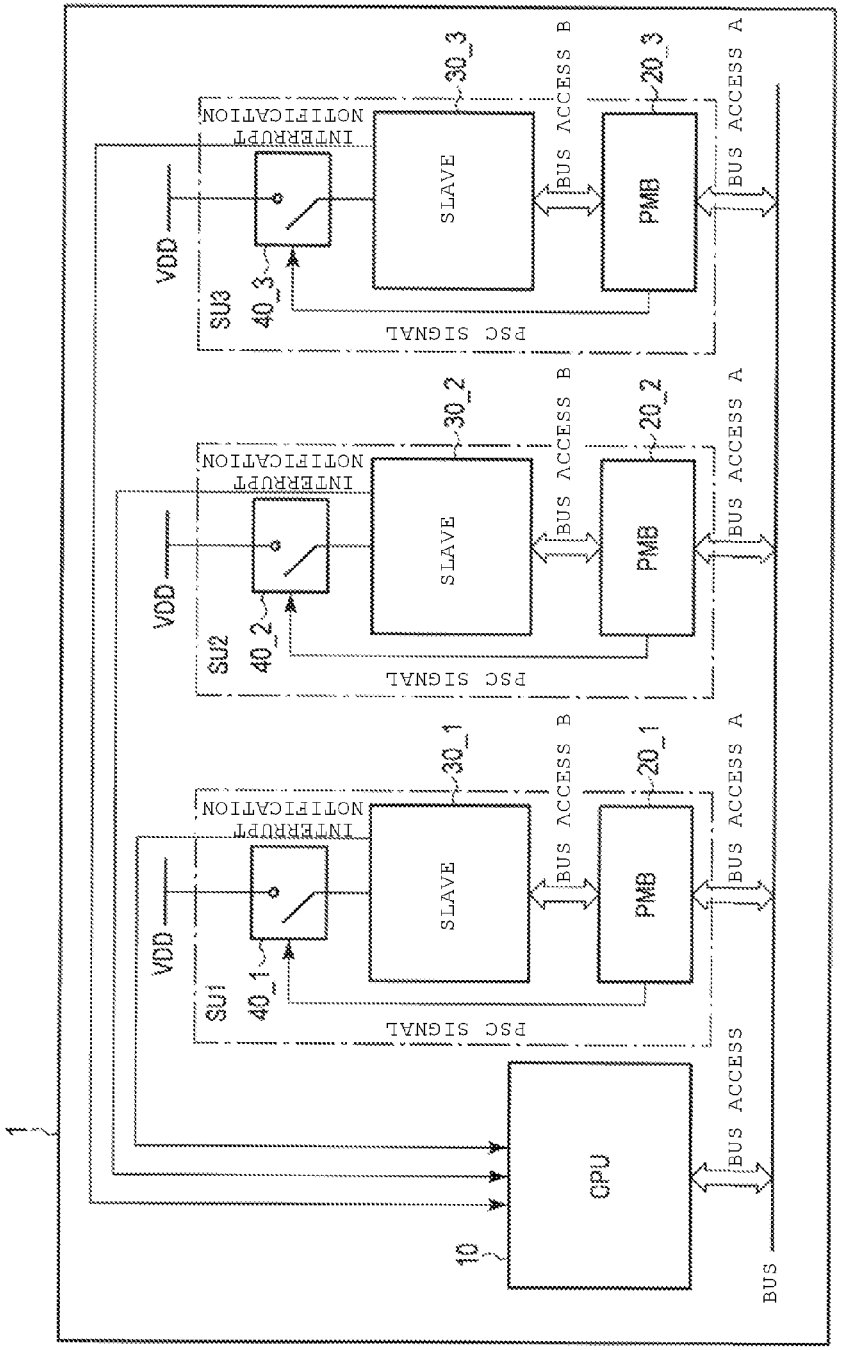
FIG. 16 is a block diagram of a semiconductor device according to a sixth embodiment.

FIG. 16 is a block diagram illustrating an overall configuration of the semiconductor device according to the present embodiment.

As illustrated in FIG. 16, the LSI device 1 includes the CPU 10 and three slave units SU1 to SU3.

Similar to FIG. 1 in the first embodiment, the slave units SU1 to SU3 each include the PMB circuit 20, the slave circuit 30, and the PSW circuit 40.

The PMB circuit 20 of the present embodiment is the same as that in the fifth embodiment.

The slave circuit 30 of the present embodiment is connected to the CPU 10 through an interrupt notification signal line which is separate from the internal bus. An interrupt notification signal is transmitted from the slave circuit 30 to the CPU 10 when the process of the slave circuit 30 is completed. The slave circuit 30 includes, for example, a control register (not illustrated) that sets whether to enable or disable the interrupt notification. In a state of performing a process according to the bus access from the CPU 10, the slave circuit 30 enables the interrupt notification, and in a state where the process is completed, the slave circuit 30 disables the interrupt notification.

6.2 Entire Flow of Access Operation

Next, the entire flow of the access operation will be described. The entire flow of the access operation of the present embodiment is the same as in FIG. 13 and FIG. 14 in the fifth embodiment.

In the present embodiment, instep S53, the slave circuit 30 transmits a register value for the setting of the interrupt notification to the PMB circuit 20. The PMB circuit 20 checks whether the interrupt notification is enabled or disabled, in other words, whether the slave circuit is in an unused state or in a used state, from the register value.

6.3 Timing of Bus Access

Next, the timing of the bus access will be described.

FIG. 17 is a timing chart of a bus access in the semiconductor device according to the present embodiment.

As illustrated in FIG. 17, the process up to the access to the slave circuit 30 from the CPU 10 ((a) and (b) of FIG. 17) and the process up to the start of the monitoring of the slave circuit 30 ((g) of FIG. 17) are the same as in FIG. 15 in the fifth embodiment.

The PMB circuit 20 reads the register value for the interrupt notification of the slave circuit 30, from the slave circuit 30. If it is determined that the interrupt notification signal is in a disabled state, in other words, the slave circuit 30 is determined to be in the unused state, from the read register value, the PMB circuit 20 switches the PSC signal from the "H" level to the "L" level, and turns the PSW circuit 40 to the off-state ((i) of FIG. 17). Thus, the supply of the power voltage VDD is cut off, and the slave circuit 30 enters the off-state.

6.4 Effect According to the Present Embodiment

The configuration according to the present embodiment can be applied to the fifth embodiment.

7. Modification Example

The semiconductor device according to the above embodiments includes a control circuit (CPU 10 in FIG. 1) connected to a bus (bus in FIG. 1), a first circuit (slave 30_1 in FIG. 1) that operates under the control of the control circuit, a switch element (40_1 in FIG. 1) which is connected between the first circuit and the power, and a second circuit (PMB in FIG. 1) which is connected between the bus and the first circuit, and turns the switch element to the on-state, in response to the first signal which is transmitted from the control circuit to the first circuit through the bus.

It is possible to provide a semiconductor device that can improve the reliability, by applying the above-described embodiments. The embodiments are not limited to the embodiments described herein, and various modifications are possible.

For example, the embodiment is not limited to an LSI device 1, and can be applied to semiconductor devices having a function of cutting off the power of the circuit, which is in an unused state, included circuits within.

Furthermore, the "connection" in the above embodiments includes, for example, a state of being indirectly connected by interposing anything else such as transistors or resistors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device comprising:
   a bus;
   a control circuit connected to the bus;
   a first circuit configured to operate under control of the control circuit;
   a power source;
   a switch element connected between the first circuit and the power source; and
   a second circuit connected between the bus and the first circuit, the second circuit configured to cause the switch element to enter an on-state in response to a first signal transmitted from the control circuit to the first circuit through the bus.

2. The device according to claim 1,
   wherein once the switch element enters the on-state, the second circuit transfers the first signal received from the control circuit to the first circuit.

3. The device according to claim 1,
   wherein the second circuit is further configured to cause the switch element to enter an off-state in response to a second signal which is transmitted from the control circuit to the second circuit.

4. The device according to claim 1,
   wherein the second circuit is further configured to cause the switch element to enter an off-state if no signal is transmitted and received between the control circuit and the first circuit through the bus during a first time period.

5. The device according to claim 1,
   wherein the second circuit is further configured to cause the switch element to enter an off-state in response to a second signal which is transmitted from the control circuit to the first circuit through the bus.

6. The device according to claim 1,
   wherein the first circuit includes a register configured to store information on the operating state of the first circuit, and
   wherein the second circuit is configured to read the information stored in the register in the first circuit, and turns the switch element to an off-state in response to the information.

7. The device according to claim 1,
   wherein the second circuit includes
      a buffer configured to delay transmission of the first signal transmitted to the first circuit from the control circuit to the first circuit;
      a detection circuit configured to detect the first signal transmitted from the control circuit to the first circuit; and
      a third circuit configured to cause the first signal to be transmitted to the first circuit from the buffer at a time after the switch element enters the on-state, in response to the detection of the first signal.

8. The device according to claim 7, wherein the third circuit includes an internal timer configured to determine when a pre-set time period after the switch element enters the on-state has passed, and
   the third circuit is further configured to cause the buffer to transmit the first signal to the first circuit from the buffer when the pre-set time period has passed.

9. A semiconductor device comprising:
a bus;
a control circuit connected to the bus, and a plurality of slave units connected to the bus; and
a power source; wherein
at least two of the slave units comprise:
a first circuit configured to operate under control of the control circuit;
a switch element connected between the first circuit and the power source; and
a second circuit connected between the bus and the first circuit, the second circuit configured to cause the switch element to enter an on-state in response to a first signal transmitted from the control circuit to the first circuit through the bus.

10. The device according to claim 9,
wherein after the switch element enters the on-state, the second circuit transfers the first signal received from the control circuit to the first circuit.

11. The device according to claim 9,
wherein the second circuit is further configured to cause the switch element to enter an off-state in response to a second signal which is transmitted from the control circuit to the second circuit.

12. The device according to claim 9,
wherein the second circuit is further configured to cause the switch element to enter an off-state if no signal is transmitted from the control circuit to the first circuit through the bus during a first time period.

13. The device according to claim 9,
wherein the second circuit is further configured to cause the switch element to enter an off-state in response to a second signal which is transmitted from the control circuit to the first circuit through the bus.

14. The device according to claim 9, wherein
the first circuit includes a register configured to store information on the operating state of the first circuit, and
the second circuit is configured to receive the information stored in the register in the first circuit, and turn the switch element to an off-state in response to the information.

15. The device according to claim 9,
wherein the second circuit includes
a buffer configured to delay transmission of the first signal transmitted to the first circuit from the control circuit to the first circuit;
a detection circuit configured to detect the first signal transmitted from the control circuit to the first circuit; and
a third circuit configured to cause the first signal to be transmitted to the first circuit from the buffer at a time after the switch element enters the on-state, in response to the detection thereby of the first signal.

16. The device according to claim 15, wherein the control circuit includes an internal timer configured to determine when a pre-set time period after the switch element enters the on-state has passed, and
the third circuit is further configured to cause the buffer to transmit the first signal to the first circuit from the buffer when the pre-set time period has passed.

17. A semiconductor device, comprising:
a bus;
a control circuit connected to the bus;
a power source;
a first circuit configured to operate under control of the control circuit, the first circuit connected to a second circuit, the first circuit configured to operate under the control of the control circuit by control signals sent by the control circuit through the bus and through the second circuit;
a second circuit connected to the bus;
a switch connected to the first circuit and the power source, the switch having an on-state in which power flows therethrough to the first circuit and an-off state in which power is blocked from passage therethrough, wherein
the second circuit is configured to receive a control signal from the control circuit over the bus, and in response thereto perform at least one of the following
(a) send the control signal to the first circuit after the passage of a predetermined amount of time;
(b) send a signal to the switch to cause the switch to change from an off-state to an on-state and thereby cause power to flow to the first circuit; or
(c) send a signal to the switch to cause the switch to change from an on-state to an off-state and thereby cause the switch to prevent power from flowing to the first circuit.

18. The device according to claim 17, wherein
when the switch is in the off-state, in response to receipt of a control signal from the control circuit over the bus the second circuit is configured to send a signal to the switch to cause the switch to enter the on-state and thereby cause power to flow to the first circuit; and
to send the control signal to the first circuit after the passage of a predetermined amount of time.

19. The device according to claim 17, wherein, when the switch is in the on-state, in response to receipt of a signal to stop the first circuit from the control circuit over the bus, the second circuit sends a signal to the switch to cause the switch to enter the off-state and thereby prevent power flow to the first circuit.

20. The device according to claim 19, wherein the second circuit is further configured to delay sending the signal to the switch to cause the switch to enter the off-state and thereby prevent power flow to the first circuit.

21. The device according to claim 20, where the delay is a predetermined time based upon a signal previously received by, and stored in, the second circuit.

22. The device according to claim 20, wherein
the delay is the longer of (i) a predetermined time based upon a signal previously received by, and stored in, the second circuit, and (ii) a delay period based upon whether the first circuit is operating.

23. The device according to claim 22, wherein
the first circuit is configured to send an operating status signal to the control circuit.

* * * * *